(12) United States Patent
Ando et al.

(10) Patent No.: US 8,236,483 B2
(45) Date of Patent: Aug. 7, 2012

(54) METHOD OF FORMING RESIST PATTERN

(75) Inventors: Tomoyuki Ando, Kawasaki (JP); Sho Abe, Kawasaki (JP); Ryoji Watanabe, Kawasaki (JP); Komei Hirahara, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 371 days.

(21) Appl. No.: 12/533,685

(22) Filed: Jul. 31, 2009

(65) Prior Publication Data

US 2010/0035192 A1 Feb. 11, 2010

(30) Foreign Application Priority Data

Aug. 6, 2008 (JP) ................................ 2008-203201

(51) Int. Cl.
*G03F 7/26* (2006.01)
(52) U.S. Cl. ........................ 430/322; 430/394
(58) Field of Classification Search ................ 430/311, 430/397, 394, 325, 322, 270.1
See application file for complete search history.

(56) References Cited

U.S. PATENT DOCUMENTS

| 5,945,517 | A | 8/1999 | Nitta et al. |
| 6,153,733 | A | 11/2000 | Yukawa et al. |
| 7,074,543 | B2 | 7/2006 | Iwai et al. |
| 2008/0131819 | A1* | 6/2008 | Misumi et al. ............ 430/322 |
| 2008/0160423 | A1* | 7/2008 | Chen et al. ............... 430/5 |

FOREIGN PATENT DOCUMENTS

| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | 2008-098231 | 4/2008 |
| JP | 2008-159874 | 7/2008 |
| WO | WO 2004-074242 | 9/2004 |
| WO | WO 2004/076495 | 9/2004 |

OTHER PUBLICATIONS

Levinson, Principles of Lithography $2^{nd}$ Edition, SPIE Press, p. 273-282 (2005).
Levinson, Principles of Lithography $2^{nd}$ Edition, SPIE Press, p. 295-307 (2005).
Gil et al., "First Microprocessors with Immersion Lithography," Optical Microlithography XVIII, Proceedings of SPIE vol. 5754, pp. 119-128 (2005).
Ebihara, et al., Beyond $k_1$=0.25 lithography : 70nm L/S patterning using KrF scanners, Proceedings of SPIE vol. 5256, $23^{rd}$ Annual BACUS Symposium on Photomask Technology, pp. 985 to 994 (2003).

* cited by examiner

*Primary Examiner* — Kathleen Duda
*Assistant Examiner* — Caleen Sullivan
(74) *Attorney, Agent, or Firm* — Knobbe Martens Olson & Bear LLP

(57) ABSTRACT

A method of forming a resist pattern including: forming a resist film on a substrate using a chemically amplified negative resist composition; forming a latent image of a first line and space pattern by subjecting the resist film to first exposure through a photomask; forming a latent image of a second line and space pattern so as to intersect with the latent image of the first line and space pattern by subjecting the resist film to second exposure through a photomask; and subjecting the resist film to developing to form a hole pattern in the resist film.

8 Claims, 5 Drawing Sheets

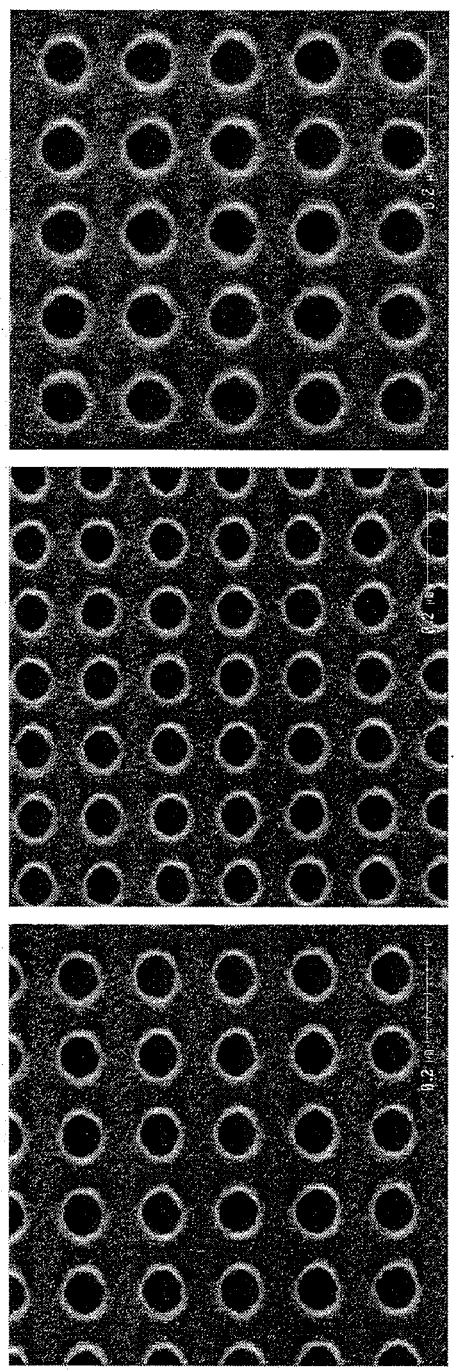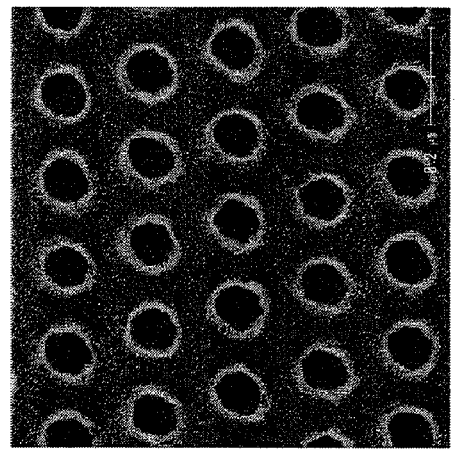
FIG. 3A
FIG. 3B

METHOD OF FORMING RESIST PATTERN

BACKGROUND OF THE INVENTION

1. Field of the Invention

The present invention relates to a method of forming a resist pattern in which a resist pattern is formed by a double exposure process.

Priority is claimed on Japanese Patent Application No. 2008-203201, filed Aug. 6, 2008, the content of which is incorporated herein by reference.

2. Description of Related Art

Techniques (pattern-forming techniques) in which a fine pattern is formed on top of a substrate, and a lower layer beneath that pattern is then fabricated by conducting etching with this pattern as a mask are widely used in the semiconductor industry for IC fabrication and the like, and are attracting considerable attention.

These types of fine patterns are usually formed from an organic material, and are formed, for example, using a lithography method or a nanoimprint method or the like. In lithography techniques, for example, a resist film composed of a resist composition that contains a base material component such as a resin is formed on top of a supporting material such as a substrate, and the resist film is subjected to selective exposure of radial rays such as light or electron beam through a photomask in which a pattern (mask pattern) with a predetermined shape has been formed, followed by a developing treatment, thereby forming a resist pattern having a predetermined shape on the resist film. A resist composition in which the exposed portions become soluble in a developing solution is called a positive-type, and a resist composition in which the exposed portions become insoluble in a developing solution is called a negative-type. Using this resist pattern as a mask, a semiconductor or the like is produced by conducting a step in which the substrate is processed by etching.

In recent years, advances in lithography techniques have led to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. Furthermore, for further improving the resolution, research is also being conducted into lithography techniques that use an exposure light source having a wavelength shorter than these excimer lasers, such as $F_2$ excimer lasers, electron beam, extreme ultraviolet radiation (EUV), and X ray.

Resist compositions for use with these types of exposure light sources require lithography properties such as a high resolution capable of reproducing patterns of minute dimensions, and a high level of sensitivity to these types of exposure light sources. As a resist composition which satisfies these conditions, a chemically amplified resist composition is used, which includes a base material component that exhibits a changed solubility in an alkali developing solution under action of acid and an acid generator that generates acid upon exposure (for example, refer to Patent Document 1). For example, a chemically amplified positive resist typically contains, as a base material component, a resin which exhibits increased solubility in an alkali developing solution under the action of acid. In the formation of a resist pattern, when acid is generated from the acid generator upon exposure, the exposed portions become soluble in an alkali developing solution.

Further, as one of the techniques to further improve the resolution, super-resolution techniques have also been studied, such as a phase shift method in which a phase shift mask is used as a photomask (for example, refer to Non-Patent Document 1), and a modified illumination method (for example, refer to Non-Patent Document 2) in which a modified illumination system such as a dipole illumination system is employed as illumination conditions during exposure.

On the other hand, in the production of dynamic random access memory (DRAM) or flash memory, a pattern in which holes are regularly arranged (hereafter, referred to as "contact hole pattern") is formed. As higher packing densities and further miniaturization are required for cell structures, there is an increase in the demand for techniques which enable formation of finer contact hole patterns at higher densities.

Conventionally, chemically amplified positive resist compositions have been widely used for formation of fine contact hole patterns. This is because when a chemically amplified negative resist composition is used, the mask structure becomes complex, and contrast satisfactory for forming images is difficult to achieve, and properties of the formed patterns are inferior to those obtained when a chemically amplified positive resist composition is used, and thus the use of a chemically amplified negative resist composition for forming contact hole patterns is not common.

However, when forming a contact hole pattern by subjecting a resist film formed of a chemically amplified positive resist composition to exposure through a photomask, as compared to the case where a line and space pattern is formed, incident energy of light to the resist film cannot be optically increased, and thus there is a limit for improving the resolution. That is, when the resolution limits of resist patterns are compared using Rayleigh's formula (resolution limit=k1× (wavelength of light source)/(lens aperture)), k1 values for line and space patterns fall within a range between 0.25 and 0.3, whereas k1 values for hole patterns fall within a range between 0.4 and 0.5. In other words, regardless of the wavelength of exposure light source or lens aperture, the resolution limit for hole patterns cannot match the level of resolution limit achieved for line and space patterns.

Further, although reducing the distance between individual holes is important for enhancing packing densities of contact hole patterns, it is difficult to shorten the distance with the method described above.

Furthermore, a problem also arises in that roughness can develop on the upper surface and side wall surfaces of the formed pattern. For example, roughness on the side wall surfaces of a pattern, so-called line edge roughness (LER), can cause various defects such as distortions around the holes in hole patterns, and consequently has the potential to adversely affect the formation of very fine semiconductor elements. This problem of roughness becomes more significant as the pattern dimensions are reduced.

A double patterning process is one of the techniques which is capable of forming contact hole patterns of high resolution.

There are several different types of double patterning process and for forming contact hole patterns, a double patterning process in which a lithography step (from application of resist compositions to exposure and developing) and an etching step are repeated twice or more to form a pattern can be used (for example, refer to Non-Patent Document 3). Formation of contact hole patterns according to such a double patterning process can be conducted, for example, by the procedure shown in FIGS. 5A to 5F.

In other words, as shown in FIG. 5A, a laminate is prepared in which a substrate 101, a lower-layer film 102 and a hard mask 103 are laminated. Subsequently, a resist film is formed on the hard mask 103, and the resist film is subjected to selective exposure and developing through a photomask 105, as shown in FIG. 5B, thereby forming a resist pattern 104 in which a plurality of hole patterns are arranged with a hole diameter of d/4 and a pitch d.

Then, the resist pattern 104 is subjected to etching by using the hard mask 103 as a mask, followed by the removal of the remaining resist pattern 104. As a result, as shown in FIG. 5C, a hard mask 103' is obtained in which a resist pattern is transferred.

Subsequently, as shown in FIG. 5D, the position of the photomask 105 is shifted, and a resist composition is applied on the hard mask 103'. As a result, a resist film is formed which fills in the gaps within the hard mask 103' and which has a greater film thickness than that of the hard mask 103'. Then, the resist film is subjected to selective exposure through the shifted photomask 105, followed by developing to form a resist pattern 106.

Then, the resist pattern 106 is subjected to etching by using the hard mask 103' as a mask, followed by the removal of the remaining resist pattern 106. As a result, as shown in FIG. 5E, a hard mask 103" is obtained in which a pattern is transferred, the pattern formed of a plurality of hole patterns arranged with a hole diameter of d/4 and a pitch d/2.

The pattern of the hard mask 103" is transferred to the lower-layer film 102 by conducting an etching process using the hard mask 103" as a mask. As a result, as shown in FIG. 5F, a pattern 102' is formed which has a pitch as large as half the pitch of the photomask 105 used.

As described above, according to the double patterning process, a resist pattern with a higher level of resolution can be formed, as compared to the case where a resist pattern is formed by a single lithography step (namely, a single patterning process), even when a light source with the same exposure wavelength is used, or even when the same resist composition is used. Furthermore, the double patterning process can be conducted using a conventional exposure apparatus.

However, in the conventional double patterning process, formation of a lower-layer film on a substrate is usually required, and each of patterning of a resist film and etching of a hard mask layer below needs to be conducted at least twice, which results in the increase of number of steps required and amount of chemical drugs used, and ultimately the increase in the production cost.

As one of the double patterning processes, a double exposure technique is also proposed, in which exposure is conducted twice or more after formation of a resist film, followed by developing to form a resist pattern (for example, refer to Patent Documents 2 and 3). Like the double patterning process described above, this type of double exposure technique is also capable of forming a resist pattern with a high level of resolution, and also has an advantage in that fewer number of steps is required, as compared to the above-mentioned double patterning process.

However, when contact hole patterns are formed by conventional techniques involving multiple exposure, various problems such as an overlay problem arise, and thus formation of fine and high-density contact hole patterns has been impossible.

[Patent Document 1] Japanese Unexamined Patent Application, First Publication No. 2003-241385

[Patent Document 2] Japanese Unexamined Patent Application, First Publication No. 2008-098231

[Patent Document 3] Japanese Unexamined Patent Application, First Publication No. 2008-159874

[Non-Patent Document 1] Principles of Lithography (2nd Edition), Harry J. Levinson, SPIE Press, pp. 295-307.

[Non-Patent Document 2] Principles of Lithography (2nd Edition), Harry J. Levinson, SPIE Press, pp. 273-282.

[Non-Patent Document 3] Proceedings of SPIE (U.S.), vol. 5256, pp. 985-994 (2003)

SUMMARY OF THE INVENTION

The present invention takes the above circumstances into consideration, with an object of providing a novel method of forming a resist pattern which is capable of forming a fine contact hole pattern by a double exposure process using a chemically amplified negative resist composition.

The method of forming a resist pattern according to the present invention which solves the above-mentioned problems is characterized by having the steps of: forming a resist film on a substrate using a chemically amplified negative resist composition;

forming a latent image of a first line and space pattern by subjecting the resist film to first exposure through a photomask; forming a latent image of a second line and space pattern so as to intersect with the first line and space pattern by subjecting the resist film to second exposure through a photomask; and subjecting the resist film to developing to form a hole pattern in the resist film.

In the present description and the claims, the term "exposure" is used as a general concept that includes irradiation with any form of radiation.

A "structural unit" refers to a monomer unit that contributes to the formation of a resin component (namely, a polymer or copolymer).

An "alkyl group", unless otherwise specified, includes linear, branched and cyclic, monovalent saturated hydrocarbon groups.

The term "alkylene group" includes linear, branched or cyclic divalent saturated hydrocarbon groups, unless otherwise specified.

A "halogenated alkyl group" is a group in which a part or all of the hydrogen atoms of an alkyl group is substituted with halogen atoms. Examples of the halogen atom include a fluorine atom, a chlorine atom, a bromine atom and an iodine atom.

The term "aliphatic" is a relative concept used in relation to the term "aromatic", and defines a group or compound that has no aromaticity.

According to the present invention, there are provided a novel method of forming a resist pattern which is capable of forming a fine contact hole pattern by a double exposure process using a chemically amplified negative resist composition.

BRIEF DESCRIPTION OF THE DRAWINGS

FIGS. 3A and 3B show SEM images of hole patterns formed in Example 1 and Comparative Example 1 (FIG. 3A: from left-hand side, a hole pattern (hole diameter of 80 nm, pitch of 160 nm), a hole pattern (hole diameter of 70 nm, pitch of 140 nm), and a hole pattern (hole diameter of 65 nm, pitch of 130 nm) formed in Example 1; FIG. 3B: a hole pattern (hole diameter of 85 nm, pitch of 170 nm) formed in Comparative Example 1.

DESCRIPTION OF REFERENCE NUMERALS AND CHARACTERS

11: Supporting material; 12: Resist film; 12': Line-like latent images of first line and space pattern; 12": Line-like latent images of second line and space pattern; 101: Substrate; 102: Lower-layer film; 103: Hard mask; 104: Resist pattern; 105: Photomask; 106: Resist pattern.

DETAILED DESCRIPTION OF THE INVENTION

The method of forming a resist pattern according to the present invention includes: forming a resist film on a substrate using a chemically amplified negative resist composition;

forming a latent image of a first line and space pattern by subjecting the resist film to first exposure through a photomask; forming a latent image of a second line and space pattern so as to intersect with the first line and space pattern by subjecting the resist film to second exposure through a photomask; and subjecting the resist film to developing to form a hole pattern in the resist film.

The method of forming a resist pattern according to the present invention will be described below with reference to the attached diagrams.

FIG. 1 is a flow chart showing a method for forming a resist pattern according to a first aspect of the present invention.

Figure 1A:
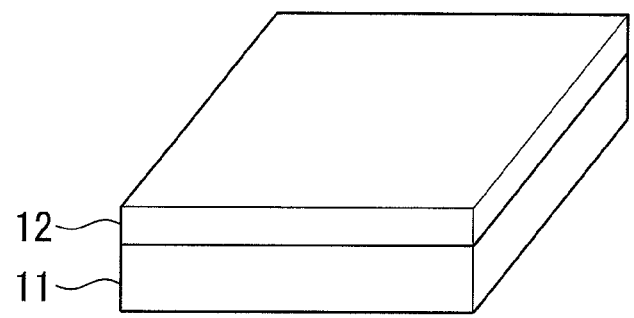
FIGS. 1A to 1C show a flow chart describing a preferred embodiment of a method for forming a resist pattern according to the present invention.

In the present embodiment, as shown in FIG. 1A, a chemically amplified negative resist composition is first applied onto a substrate 11 to form a resist film 12.

Figure 1B:
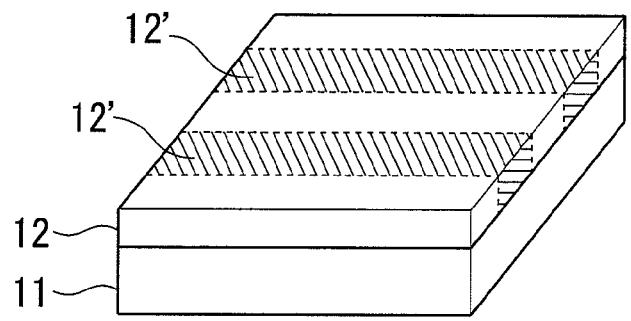

Then, by subjecting the resist film 12 to a first exposure through a photomask (not shown) for forming a line and space pattern, as shown in FIG. 1B, a latent image of a first line and space pattern is formed in which a plurality of line-like latent images 12' are arranged in parallel.

In the present description and the claims, the term "latent image" refers to a region (exposed portion) in the resist film irradiated with radiation that is transmitted through a light transmitting portion within a photomask.

Figure 1C:
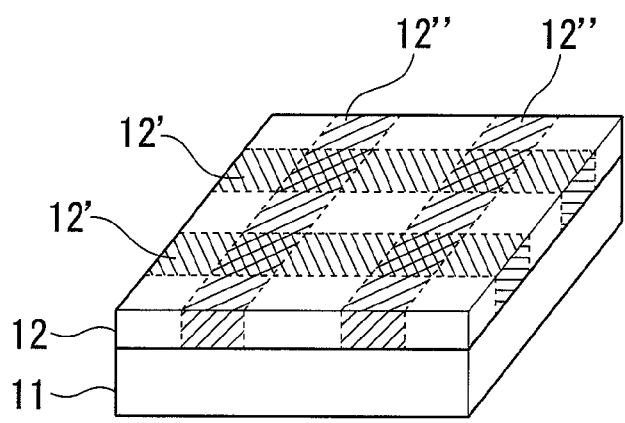

Subsequently, by subjecting the resist film 12 to a second exposure through a photomask (not shown) for forming a line and space pattern, a latent image of a line and space pattern is formed in which a plurality of line-like latent images 12" that intersect with the line-like latent images 12' are arranged in parallel. As a result, as shown in FIG. 1C, a lattice-like latent image is formed on the resist film 12, in which the line-like latent images 12' of the first line and space pattern and the line-like latent images 12" of the second line and space pattern intersect with each other.

Then, the resist film 12 in which the above-mentioned latent image is formed is subjected to a post exposure bake treatment, followed by a developing treatment in an alkali developing solution. Accordingly, the regions with no latent image formed (namely, unexposed portions) are dissolved and removed, whereas the exposed portions are not removed and therefore remain, and a hole pattern is formed as a result at a position where the unexposed portions resided.

The method of forming a resist pattern according to the present aspect will be described in further detail below.

The substrate 11 is not specifically limited and a conventionally known substrate can be used. For example, substrates for electronic components, and such substrates having wiring patterns formed thereon can be exemplified. Specific examples of the material of the substrate include a silicon wafer; metals such as copper, chromium, iron and aluminum; and glass. Suitable materials for the wiring pattern include copper, aluminum, nickel, and gold.

Further, as the substrate 11, any one of the above-exemplified substrates provided with an inorganic and/or organic film on the surface thereof may also be used. As the inorganic film, an inorganic antireflection film (inorganic BARC) can be used. As the organic film, an organic antireflection film (organic BARC) and a lower-layer film used in a multilayer resist method can be used. Provision of an organic film is particularly desirable because a pattern with a high aspect ratio can be formed on a substrate, which is useful in the production of semiconductors or the like.

Here, a "multilayer resist method" is a method in which at least one layer of an organic film (lower-layer film) and at least one layer of a resist film are provided on a substrate, and a resist pattern formed on the upper resist film is used as a mask to conduct patterning of the lower-layer film. This method is considered as being capable of forming a pattern with a high aspect ratio. The multilayer resist method can be broadly classified into a method in which a double-layer structure consisting of an upper resist film and a lower-layer film is formed, and a method in which a multilayer structure having at least three layers consisting of an upper resist film, a lower-layer film and at least one intermediate layer (a thin metal film or the like) provided between the upper resist film and the lower-layer film is formed. According to the multilayer resist method, a desired thickness is ensured by the lower-layer film, and as a result, the thickness of the resist film can be reduced, and an extremely fine pattern with a high aspect ratio can be formed.

An inorganic film can be formed, for example, by applying an inorganic antireflection film-forming composition, such as a silicon-based material, to the surface of a substrate, and then conducting a bake treatment.

An organic film can be formed, for example, by using a spinner or the like to apply an organic film-forming material, prepared by dissolving a resin component or the like to constitute the organic film in an organic solvent, to the surface of a substrate, and then conducting a bake treatment under conditions that include heating at a temperature that is preferably within a range from 200 to 300° C., preferably for a period of 30 to 300 seconds, and more preferably for 60 to 180 seconds.

The organic film-forming material used in this process need not necessarily exhibit the type of sensitivity to a light source or electron beam shown by a resist film, and thus the organic film-forming material may or may not exhibit such sensitivity. More specifically, the types of resists or resins typically used in the production of semiconductor elements and liquid crystal display elements can be used.

Furthermore, because a resist pattern can be transferred to an organic film and thus an organic film pattern can be formed by etching an organic film using a resist pattern, the organic film-forming material is preferably a material that is capable of forming an organic film that can be subjected to etching, and particularly dry etching. Of the various possibilities, materials that are capable of forming an organic film that can be etched by an oxygen plasma etching technique or the like are particularly preferred. As this type of organic film-forming material, the materials conventionally used for forming organic films such as organic BARC are suitable. Examples include the ARC series of products manufactured by Brewer Science Ltd., the AR series of products manufactured by Rohm and Haas Company, and the SWK series of products manufactured by Tokyo Ohka Kogyo Co., Ltd.

There are no particular limitations on the chemically amplified negative resist composition, and known chemically amplified negative resist compositions can be used.

Here, a chemically amplified resist composition is a resist composition containing an acid-generator component that generates acid upon exposure as an essential component, and when acid is generated from the acid-generator component upon exposure, the action of that acid causes a change in the solubility of the entire chemically amplified resist composition in an alkali developing solution. For example, a chemically amplified negative resist composition typically contains a resin that is soluble in an alkali developing solution (an alkali-soluble resin) and a cross-linking agent, and when acid is generated from the acid-generator component upon exposure, the action of that acid causes the alkali-soluble resin and the cross-linking agent to react, causing a decrease in the solubility of the alkali-soluble resin in an alkali developing solution.

As a result, when exposure is conducted on the resist film formed by using a chemically amplified negative resist composition, the solubility of the exposed portions of the resist film in an alkali developing solution is decreased due to the action of acid generated from the acid-generator component, whereas the solubility of the unexposed portions of the resist film in an alkali developing solution remains unchanged. Therefore, the unexposed portions are dissolved and removed by alkali developing, and hence, a resist pattern can be formed.

Chemically amplified negative resist compositions will be described later in further detail.

There are no particular limitations on the method for forming the resist film 12 by applying a chemically amplified negative resist composition on the substrate 11, and any conventional methods can be used. More specifically, for example, a chemically amplified negative resist composition is applied onto the substrate 11 using a known coating device such as a spinner, and is then baked and dried by conducting a bake treatment (prebake) at a temperature of 80 to 130° C. for 40 to 120 seconds, preferably 60 to 90 seconds, thereby forming the resist film 12.

The thickness of the resist film 12 is preferably within the range from 50 to 500 nm, and more preferably from 50 to 450 nm. By ensuring that the thickness of the resist film 12 satisfies the above-mentioned range, a resist pattern with a high level of resolution can be formed, and a satisfactory level of etching resistance can be achieved.

In the present invention, during the first and second exposure, it is preferable to appropriately select a photomask and/or illumination conditions so that the solubility contrast of the resist film 12 in an alkali developing solution, as a result of the reaction effected by the combined total of incident energy which has been applied to the resist film 12 during each exposure process, is sufficient enough for the ultimate pattern formation.

In other words, the distribution of energy incident to the resist film 12 in which latent images are formed by the first and second exposure is the result of the combined total of the incident energy of the first exposure and the incident energy of the second exposure. In the resist film 12, reactions (namely, generation of acid from an acid-generator component, changes in the solubility in an alkali developing solution by the action of this acid, and the like) are effected in accordance with the combined total of the incident energy.

Accordingly, with respect to the distribution of incident energy within the resist film 12 after the first and second exposure, the difference in the solubility within an alkali developing solution (namely, the solubility contrast in an alkali developing solution) of the unexposed portions (the regions where the space portions within the first line and space pattern and the space portions within the second line and space pattern overlap) and the exposed portions (the regions where latent images are formed) is increased, as the combined total of energy incident to the unexposed portions approaches zero. As a result, satisfactory hole patterns can be formed. That is, by preventing the reduction of alkali solubility due to the energy of incident light (namely, the reduction of development rate) as much as possible within the unexposed portions of the resist film 12, satisfactory solubility contrast between the unexposed portions and the exposed portions in an alkali developing solution can be achieved, and thus distinct hole patterns can be formed.

From the above-mentioned viewpoints, in the present invention, the photomask for forming line and space patterns which is used during the first and second exposure is preferably a phase shift mask.

A phase shift mask is a photomask in which a portion that changes the phase of light (that is, a shifter) is provided on the photomask. Accordingly, by using a phase shift mask, the incidence of light to the unexposed portions can be suppressed, and the solubility contrast between the unexposed portions and the exposed portions in an alkali developing solution can be improved.

Examples of the phase shift masks include a half-tone type phase shift mask and a Levenson type phase shift mask. Commercially available products of these phase shift masks can be used. Specific examples of the half-tone type phase shift masks include those in which a MoSi (molybdenum silicide) film, a chromium film, a chromium oxide film, an oxynitriding silicon film, or the like is formed, as a light shielding portion (shifter film) having a transmittance of about a several to 10% (typically, 6%), on a substrate generally made of quartz glass.

However, the present invention is not limited to those described above, and a photomask other than the above-mentioned phase shift masks may be used. Examples of such photomasks include a binary mask. A binary mask is a photomask in which the transmittance of light shielding portion is 0%. As a binary mask, those in which a chromium film, a chromium oxide film, or the like is formed as a light shielding portion on a quartz glass substrate are generally used.

Further, from the above-mentioned viewpoints, in the present invention, a modified illumination system is preferably adopted as the illumination condition during the first and second exposure.

Examples of the modified illumination systems include an annular illumination system, a dipole illumination system, and a crosspole illumination system.

In the present invention, it is particularly desirable to conduct the aforementioned exposure steps by a dipole illumination system, because the latent images of fine line and space patterns can be formed with satisfactory contrast, and contact hole patterns having a high level of resolution and density can be readily formed.

In the dipole illumination system, only the resolution of patterns in a certain direction (that is, an optimized direction) is enhanced. When conducting an exposure step by a dipole illumination system through a photomask for forming line and space patterns, the optimized incident direction of light intersects with the line direction. For example, when a photomask is used in which a line pattern is formed in the Y-axis direction, exposure is conducted by a dipole-X system (i.e., dipole illumination in the X-axis direction).

However, the present invention is not limited to the procedures described above, and a normal illumination system may be used for the first and/or second exposure.

The wavelength to be used for the first and second exposure processes is not particularly limited and the exposure processes can be conducted using radiations such as KrF excimer laser, ArF excimer laser, $F_2$ excimer laser, extreme ultraviolet radiation (EUV), vacuum ultraviolet rays (VUV), electron beam (EB), X-rays, and soft X-rays. The present invention is suited when an excimer laser, particularly an ArF excimer laser is used as an exposure light source.

The first and second exposure processes can be either a general exposure (dry exposure) conducted in air or an inert gas such as nitrogen, or immersion exposure.

The immersion exposure is a lithography method, so-called liquid immersion lithography, in which exposure (immersion exposure) is conducted in a state where the region between the objective lens of the exposure apparatus and the sample is filled with a liquid (an immersion medium) that has a larger refractive index than the refractive index of air, and known as a technique for further improving the resolution (see, for example, Proceedings of SPIE (U.S.), vol. 5754, pp. 119-128 (2005)). According to this type of immersion exposure, it is considered that higher resolutions equivalent to those obtained using a shorter wavelength light source or a larger numerical aperture (NA) lens can be obtained using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithographic properties such as resolution.

In immersion lithography, exposure (immersion exposure) is conducted in a state where the region between the lens and the resist film formed on a wafer (which was conventionally filled with air or an inert gas such as nitrogen) is filled with a solvent (an immersion medium) that has a larger refractive index than the refractive index of air. More specifically, in immersion lithography, the region between the resist film formed in the above-described manner and lens at the lowermost portion of the exposure apparatus is filled with a solvent (an immersion medium) that has a larger refractive index than the refractive index of air, and in this state, the resist film is subjected to exposure (immersion exposure) through a desired photomask.

The immersion medium preferably exhibits a refractive index larger than the refractive index of air but smaller than the refractive index of the resist film to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

In the present invention, by subjecting the resist film 12 to a first exposure to form a latent image of a first line and space pattern, and then subjecting the resist film 12 to a second exposure, a latent image of a second line and space pattern is formed which intersects with the latent image of the first line and space pattern.

At this time, the extent of the intersection angle between the latent image of the first line and space pattern and the latent image of the second line and space pattern (namely, an angle formed between the line-like latent images 12' of the first line and space pattern and the line-like latent images 12" of the second line and space pattern) is not particularly limited, but is preferably within the range from 15 to 90°, more preferably from 30 to 90°, still more preferably from 60 to 90°, and most preferably 90°, with due consideration of the limitations in the mask production method, illumination conditions, and the like.

Examples of the methods through second exposure for forming a latent image of a second line and space pattern which intersects with a latent image of a first line and space pattern include the following methods (1) to (3).

(1) A method in which a latent image of a first line and space pattern and a latent image of a second line and space pattern are each formed using photomasks for forming line and space patterns which have different line directions.

(2) A method in which a step for rotating the aforementioned supporting material is conducted prior to the second exposure step.

(3) A method in which a step for rotating the photomask used in the aforementioned first exposure step is conducted prior to the second exposure step.

When the above-mentioned method (1) is used, for example, in the first exposure step, exposure is conducted by a dipole-X system (dipole illumination in the X-axis direction) using a photomask in which a line pattern is formed in the Y-axis direction, and then in the second exposure step, exposure is conducted by a dipole-Y system (dipole illumination in the Y-axis direction) using a photomask in which a line pattern is formed in the X-axis direction, thereby forming a latent image in which a latent image of a first line and space pattern and a latent image of a second line and space pattern are intersected with each other at an angle of 90°.

With respect to the above-mentioned method (2), rotation of the supporting material can be conducted by moving a stage (namely, a board which is mounting the supporting material) inside an exposure apparatus.

When the above-mentioned method (2) is used, for example, in the first exposure step, exposure is conducted by a dipole-X system (dipole illumination in the X-axis direction) using a photomask in which a line pattern is formed in the Y-axis direction, and then exposure is conducted as the second exposure step by a dipole-X system (dipole illumination in the X-axis direction) through the photomask used in the first exposure step, thereby forming a latent image in which a latent image of a first line and space pattern and a latent image of a second line and space pattern are intersected with each other at an angle of 90°.

With respect to the above-mentioned method (3), rotation of the photomask can be conducted by controlling a program in the exposure apparatus used. At this time, if patterns extended in both X-axis and Y-axis directions coexist in a mask pattern, the photomask may not only be rotated but also be moved arbitrarily in the horizontal direction.

When the above-mentioned method (3) is used, for example, in the first exposure step, exposure is conducted by a dipole-X system (dipole illumination in the X-axis direction) using a photomask in which a line pattern is formed in the Y-axis direction, and then this photomask is rotated relative to the line direction by 90° used as the photomask in the second exposure step, and the second exposure step is conducted by a dipole-Y system (dipole illumination in the Y-axis direction), thereby forming a latent image in which a latent image of a first line and space pattern and a latent image of a second line and space pattern are intersected with each other at an angle of 90°.

Either one or both of the above-mentioned methods (2) and (3) may be conducted. In other words, only either one of the supporting material and the photomask may be rotated, or both of them may be rotated.

In the above-mentioned methods (1) and (2), when a photomask having the same line width and pitch as those of the photomask used in the first exposure step is used as the photomask in the second exposure step, a hole pattern with excellent circularity can be formed.

Further, when a photomask having a different line width or pitch from that of the photomask used in the first exposure step is used as the photomask in the second exposure step, a hole pattern with an elliptical shape can be formed.

Furthermore, in the above-mentioned methods (2) and (3), through an adjustment, when rotating the supporting material and/or the photomask, so that the latent image of the first line and space pattern and the latent image of the second line and space pattern intersect at an angle of less than 90°, a hole pattern with an elliptical shape can be formed. The angle in the above adjustment is preferably equal to or greater than 15° and less than 90°.

Further, in the first and second exposure steps, by making isolated slit patterns to intersect, randomly arranged hole patterns such as an isolated hole pattern can be formed.

Steps which follow the formation of the above-mentioned latent images in the first and second exposure steps can be conducted using conventional methods. For example, a post exposure baking (PEB) treatment is conducted on the resist film 12 in which the latent image is formed, and developing is then conducted using an alkali developing solution such as a 0.1 to 10% by weight aqueous solution of tetramethylammonium hydroxide (TMAH), preferably followed by rinsing with pure water, and drying. If desired, an additional bake treatment (post bake) may be conducted following the developing. In this manner, a resist pattern in the form of a contact hole pattern can be obtained. In other words, when the resist film 12 is subjected to exposure and post exposure baking treatments, the solubility of a region within the resist film in which the latent image is formed (exposed portions) in an alkali developing solution decreases, whereas the solubility of a region within the resist film in which the latent image is not formed (unexposed portions) in an alkali developing solution barely changes. Accordingly, by alkali developing the resist film 12, the unexposed portions are dissolved and removed, whereas the exposed portions are not removed and therefore remain, and a hole pattern is formed as a result at a position where the unexposed portions resided.

The PEB treatment is conducted at a temperature within a range from about 70 to 130° C. for 40 to 120 seconds, and preferably at a temperature within a range from about 80 to 110° C. for 60 to 90 seconds.

In the method of forming a resist pattern according to the present invention, after forming a resist pattern of contact hole patterns as described above, the supporting material 11 may be further etched using this resist pattern as a mask. By transferring the resist pattern through this etching process onto the supporting material 11, such as a substrate, semiconductor devices or the like can be produced.

The etching process can be conducted by a conventional method. For example, when the supporting material 11 is a substrate having an organic film thereon, this organic film is preferably etched by dry etching. In terms of achieving favorable production efficiency, oxygen plasma etching or etching using $CF_4$ gas or $CHF_3$ gas is preferred, and oxygen plasma etching is particularly desirable.

For etching a substrate, an etching treatment that uses a halogen gas is preferred, an etching treatment that uses a fluorocarbon gas is even more preferred, and an etching treatment that uses $CF_4$ gas or $CHF_3$ gas is particularly desirable.

By using the above-mentioned method of forming a resist pattern according to the present invention, a resist pattern in the form of a fine contact hole pattern (for example, a contact hole pattern having a k1 value within a range between 0.25 and 0.30 calculated according to the Rayleigh's formula shown earlier in the "Description of Related Art" section, in other words, a contact hole pattern with an equivalent level of resolution limit to that of an line and space pattern) can be formed by a double exposure process using a chemically amplified negative resist composition.

Further, by using the method of forming a resist pattern according to the present invention, formation of resist patterns with higher densities can also be achieved, and a contact hole pattern can be formed in which individual holes are arranged in close proximity, for example, with a distance between holes of about 30 to 50 nm.

Moreover, the resist pattern formed by the method of forming a resist pattern according to the present invention exhibits a low level of roughness and an excellent shape.

Furthermore, the method of forming a resist pattern according to the present invention can be conducted by using an exposure apparatus and/or a chemically amplified resist composition which are already available. Further, the method of forming a resist pattern according to the present invention adopts a double exposure process, and thus, as compared to the double patterning process in which a lithography step and a patterning step are each conducted at least twice, the number of required steps can be reduced.

Therefore, the method of forming a resist pattern according to the present invention is highly useful in the production of DRAM, flash memory, or the like, where formation of finer contact hole patterns with higher densities is required.

<Chemically Amplified Negative Resist Composition>

There are no particular limitations on the chemically amplified negative resist composition, and any of the known chemically amplified negative resist compositions can be appropriately selected for use in accordance with the exposure light source, lithographic properties, and the like.

The chemically amplified negative resist composition is typically formed of a base material component (hereafter, referred to as "component (A)") that is soluble in an alkali developing solution, an acid-generator component (B) (hereafter, referred to as "component (B)") that generates acid upon exposure, and a cross-linking agent (C) (hereafter, referred to as "component (C)"), dissolved in an organic solvent (S) (hereafter, referred to as "component (S)"). In the negative resist composition, when acid is generated from the component (B) upon exposure, the action of the acid causes cross-linking between the component (A) and the component (C), thereby changing the composition from an alkali-soluble state to an alkali-insoluble state. As a result, in the formation of a resist pattern, by conducting selective exposure of a resist film formed by applying the negative resist composition onto a substrate or the like, the exposed portions become insoluble in an alkali developing solution, whereas the unexposed portions remain soluble in the alkali developing solution, and hence, a resist pattern can be formed by alkali developing.

[Component (A)]

The term "base material component" refers to an organic compound capable of forming a film, and preferably refers to an organic compound having a molecular weight of 500 or more. When the organic compound has a molecular weight of 500 or more, the film-forming ability is improved, and a nano level resist pattern can be readily formed.

The "organic compounds having a molecular weight of 500 or more" that may be used as the base material component are broadly classified into non-polymers and polymers.

The organic compounds having a molecular weight of 500 to less than 4,000 are typically used as non-polymers. Hereafter, non-polymers having a molecular weight of 500 to less than 4,000 will be referred to as "low molecular weight compounds".

The organic compounds having a molecular weight of 2,000 or more are typically used as polymers. Hereafter, polymers having a molecular weight of 2,000 or more will be referred to as "polymeric compounds". With respect to the polymeric compound, the "molecular weight" refers to the polystyrene equivalent weight average molecular weight determined by gel permeation chromatography (GPC). In the following description, the polymeric compound is frequently referred to simply as "resin".

As the component (A), a resin that is soluble in an alkali developing solution (hereafter frequently referred to as "alkali-soluble resin") is usually used. As the alkali-soluble resin, any of the materials that have been proposed as the alkali-soluble resins for conventional chemically amplified negative resist compositions designed for use with a KrF excimer laser or negative resist compositions designed for use with an ArF excimer laser can be used, and these can be selected appropriately in accordance with the nature of the exposure light source used during resist pattern formation. Specific examples include novolak resins, polyhydroxystyrene (PHS) based resins and acrylic resins which have hydrophilic groups (such as hydroxyl groups and carboxyl groups). These resins may be used either individually, or in combination of two or more different resins.

In the present invention, the component (A) is preferably an alkali-soluble resin having a fluorinated hydroxyalkyl group such as that represented by general formula (a1-1-1) shown below.

Specific examples of preferred forms of the component (A) include a resin (A1) containing a structural unit (a1) that contains, within the main chain, an aliphatic cyclic group having a fluorinated hydroxyalkyl group.

Further, another preferred form of the component (A), other than the resin (A1), includes a resin (A2) containing a structural unit that contains an aliphatic cyclic group having a fluorinated hydroxyalkyl group, and preferably also containing a structural unit derived from an acrylate ester containing a hydroxyl group-containing aliphatic cyclic group, and/or a structural unit derived from an acrylic acid that has no cyclic structure and has an alcoholic hydroxyl group on a side chain.

[Resin (A1)]

The resin (A1) includes a structural unit (a1) that contains, within the main chain, an aliphatic cyclic group having a fluorinated hydroxyalkyl group.

Further, the resin (A1) preferably also includes, in addition to the structural unit (a1), a structural unit (a2) having a hydroxyalkyl group (hereafter, simply abbreviated as "structural unit (a2)").

Structural Unit (a1):

In the structural unit (a1), the "aliphatic cyclic group having a fluorinated hydroxyalkyl group" refers to a group in which a fluorinated hydroxyalkyl group is bonded to a carbon atom that constitutes part of a ring of an aliphatic cyclic group.

Furthermore, the description of the aliphatic cyclic group as being "within the main chain" means that at least one, and preferably two or more carbon atoms within the ring structure of the aliphatic cyclic group constitute part of the main chain of the resin (A1).

In the present invention, by including the resin (A1) containing the structural unit (a1) within the component (A), the solubility of the component (A) within an alkali developing solution is enhanced, and lithographic properties such as the resist pattern shape and line width roughness (LWR) are also improved. Further, because the resin (A1) includes the aliphatic cyclic group (such as a norbornane or tetracyclododecane structure) within the main chain, the carbon density is increased, yielding an improvement in the etching resistance.

Here, a "fluorinated hydroxyalkyl group" refers to a hydroxyalkyl group, in which a portion of the hydrogen atoms of an alkyl group have been substituted with hydroxyl groups, wherein some or all of the remaining hydrogen atoms within the hydroxyalkyl group have been substituted with fluorine atoms.

In a fluorinated hydroxyalkyl group, the fluorination increases the ease with which the hydrogen atom of the hydroxyl group is released.

In the fluorinated hydroxyalkyl group, the alkyl group is preferably a linear or branched alkyl group. Although there are no particular limitations on the number of carbon atoms within the alkyl group, the number of carbon atoms is preferably from 1 to 20, more preferably from 4 to 16, and most preferably from 4 to 12.

There are no particular limitations on the number of hydroxyl groups within the fluorinated hydroxyalkyl group, although a single hydroxyl group is preferred.

Of the various possibilities, groups in which a fluorinated alkyl group and/or a fluorine atom is bonded to the carbon atom to which the hydroxyl group is bonded (which refers to the α-position carbon atom of the hydroxyalkyl group) are preferred as the fluorinated hydroxyalkyl group.

Furthermore, the fluorinated alkyl group bonded to the α-position is preferably a group in which all of the hydrogen atoms of the alkyl group have been substituted with fluorine atoms. Furthermore, as the alkyl group of this fluorinated alkyl group, a linear or branched alkyl group of 1 to 5 carbon atoms is preferred, and an alkyl group of one carbon atom is the most desirable.

The aliphatic cyclic group in the "aliphatic cyclic group having a fluorinated hydroxyalkyl group" may be either a monocyclic group or a polycyclic group. In the structural unit (a1), the aliphatic cyclic group is preferably a polycyclic group, as such groups provide superior etching resistance and the like.

The aliphatic cyclic group includes both hydrocarbon groups formed solely from carbon and hydrogen (alicyclic groups), and heterocyclic groups in which a portion of the carbon atoms that constitute the ring structure of an alicyclic group have been substituted with a hetero atom such as an oxygen atom, nitrogen atom, or sulfur atom. These aliphatic cyclic groups may include substituent groups, and examples of these substituent groups include alkyl groups of 1 to 5 carbon atoms.

The expression "include substituent groups" means that some or all of the hydrogen atoms bonded to the carbon atoms that constitute the ring structure of the aliphatic cyclic group have been substituted with substituent groups (atoms or groups other than a hydrogen atom). In the present invention, an alicyclic group is preferred as the aliphatic cyclic group.

The aliphatic cyclic group may be either saturated or unsaturated, although a saturated group is preferred, as such groups exhibit superior transparency to ArF excimer lasers and the like, and also exhibit excellent resolution and depth of focus (DOF) and the like.

The number of carbon atoms within the aliphatic cyclic group is preferably within a range from 5 to 15.

Specific examples of the aliphatic cyclic group include the groups described below.

Examples of the monocyclic groups include groups in which two or more hydrogen atoms have been removed from a cycloalkane. Specific examples include groups in which two or more hydrogen atoms have been removed from cyclopentane or cyclohexane, and groups in which two or more hydrogen atoms have been removed from cyclohexane are preferred.

Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane.

These types of aliphatic cyclic groups can be selected appropriately from the multitude of groups that have been proposed for the resins of photoresist compositions used in ArF excimer laser processes.

Of the various possibilities, groups in which two or more hydrogen atoms have been removed from cyclohexane, adamantane, norbornane or tetracyclododecane are readily available industrially, and are consequently preferred.

Of the alicyclic groups described above, groups such as those shown in a structural unit (a1-1) below, in which three hydrogen atoms have been removed from norbornane or tetracyclododecane, are preferred, and groups in which three hydrogen atoms have been removed from norbornane are particularly desirable.

As the structural unit (a1), structural units (a1-1) represented by general formula (a1-1) shown below are preferred. By including the structural unit (a1-1), the solubility of the resin in an alkali developing solution improves significantly. Furthermore, the lithographic properties such as the resolution are also improved.

[Chemical Formula 1]

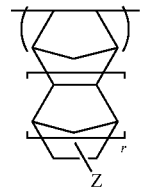

(a1-1)

wherein Z represents a fluorinated hydroxyalkyl group, and r is either 0 or 1.

In formula (a1-1), r is either 0 or 1, and is preferably 0 in terms of industrial availability.

Further, in formula (a1-1), examples of the "fluorinated hydroxyalkyl group" represented by Z include the same groups as those described above.

Of these, Z is preferably a group represented by general formula (a1-1-1) shown below, as such groups yield a particularly superior resist pattern shape as well as reduced levels of line edge roughness (LER). "Line edge roughness (LER)" refers to non-uniform unevenness in the side walls of pattern lines.

[Chemical Formula 2]

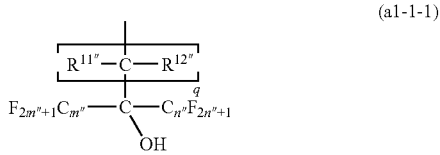

(a1-1-1)

wherein $R^{11''}$ and $R^{12''}$ each independently represents a hydrogen atom or a lower alkyl group, m" and n" each independently represents an integer of 1 to 5, and q also represents an integer of 1 to 5.

In formula (a1-1-1), $R^{11''}$ and $R^{12''}$ each independently represents a hydrogen atom or a lower alkyl group.

As the lower alkyl group, a linear or branched lower alkyl group of 1 to 5 carbon atoms is preferred, and specific examples include a methyl group, an ethyl group, a propyl group, an isopropyl group, an n-butyl group, an isobutyl group, a tert-butyl group, a pentyl group, an isopentyl group or a neopentyl group, and a methyl group is particularly desirable.

Of the various possibilities, groups in which both $R^{11''}$ and $R^{12''}$ are hydrogen atoms are particularly desirable.

q represents an integer of 1 to 5, and preferably an integer of 1 to 3, and is most preferably 1.

m" and n" each independently represents an integer of 1 to 5, and preferably an integer of 1 to 3. Groups in which both m" and n" are 1 are preferred in terms of ease of synthesis.

The structural unit (a1) may be either a single type of structural unit or a mixture of two or more different structural units.

The proportion of the structural unit (a1) within the resin (A1), relative to the combined total of all the structural units that constitute the resin (A1), is preferably within a range from 50 to 90 mol %, more preferably from 55 to 90 mol %, and still more preferably from 60 to 80 mol %. Making this proportion at least as large as the lower limit of the above-mentioned range yields an improvement in the effects achieved by including the structural unit (a1), whereas by making the proportion no more than the upper limit of the above-mentioned range, a good balance can be achieved with the other structural units.

Structural Unit (a2):

In addition to the structural unit (a1), the resin (A1) preferably also includes a structural unit (a2) having a hydroxyalkyl group.

In the present invention, including the resin (A1) containing the structural unit (a2) within the component (A) improves the solubility of the component (A) within an alkali developing solution. Further, the cross-linking of the component (A) with the component (C) is enhanced, meaning the difference in the solubility within the alkali developing solution (the contrast) between the exposed portions and the unexposed portions can be increased, enabling the composition to function more effectively as a negative resist.

As the structural unit (a2), units such as a structural unit (a210) that contains, within the main chain, an aliphatic cyclic group having a hydroxyalkyl group (hereafter abbreviated as "structural unit (a210)"), and a structural unit (a220) derived from an acrylate ester having a hydroxyl group-containing alkyl group (hereafter abbreviated as "structural unit (a220)") are preferred.

The structural unit (a2) may be either a single type of structural unit or a mixture of two or more different structural units.

Structural Unit (a210):

In the present invention, the structural unit (a210) is a structural unit that contains, within the main chain, an aliphatic cyclic group having a hydroxyalkyl group.

Examples of the structural unit (a210) include the same units as those described above for the structural unit (a1), with the exception that the "fluorinated hydroxyalkyl group" within the structural unit (a1) is replaced with an unfluorinated hydroxyalkyl group, namely a hydroxyalkyl group in which a portion of the hydrogen atoms of an alkyl group have been substituted with hydroxyl groups, and the remaining hydrogen atoms have not been substituted with fluorine atoms.

Preferred examples of the structural unit (a210) include structural units (a2-1) represented by general formula (a2-1) shown below. By including the structural unit (a2-1), lithographic properties such as the resist pattern shape and line width roughness (LWR) are improved. Further, a favorable contrast is more readily obtained, and the etching resistance also improves.

[Chemical Formula 3]

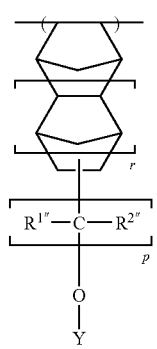

(a2-1)

wherein $R^{1''}$ and $R^{2''}$ each independently represents a hydrogen atom or a lower alkyl group; Y represents a hydrogen atom or a hydroxyalkyl group; r represents either 0 or 1; and p represents an integer of 1 to 3.

The structural unit (a2-1) represented by the aforementioned general formula (a2-1) is a structural unit containing, within the main chain, a norbornane or tetracyclododecane structure having a hydroxyalkyl group.

In formula (a2-1), $R^{1''}$ and $R^{2''}$ each independently represents a hydrogen atom or a lower alkyl group. Examples of the lower alkyl group include the same groups as those described above in relation to the lower alkyl groups represented by $R^{11''}$ and $R^{12''}$ in formula (a1-1-1). Of the various possibilities, groups in which both $R^{1''}$ and $R^{2''}$ are hydrogen atoms are particularly desirable.

Y represents a hydrogen atom or a hydroxyalkyl group.

As the hydroxyalkyl group, a linear or branched hydroxyalkyl group of 1 to 10 carbon atoms is preferred, a linear or branched hydroxyalkyl group of 1 to 8 carbon atoms is more preferred, and a linear lower hydroxyalkyl group of 1 to 3 carbon atoms is still more preferred.

There are no particular limitations on the number of hydroxyl groups or the bonding positions of those hydroxyl groups within the hydroxyalkyl group, although a single hydroxyl group is typical, and this hydroxyl group is preferably bonded to the alkyl group terminal.

Y is most preferably a hydrogen atom.

r is either 0 or 1, and is preferably 0.

p represents an integer of 1 to 3, is preferably 1 or 2, and is most preferably 1.

Specific examples of the structural unit (a2-1) include structural units represented by chemical formulas (a2-1-1) to (a2-1-7) shown below.

[Chemical Formula 4]

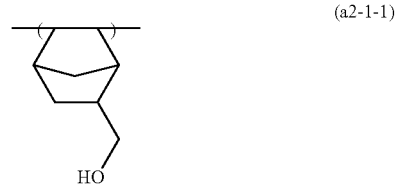

(a2-1-1)

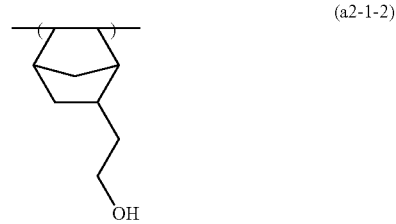

(a2-1-2)

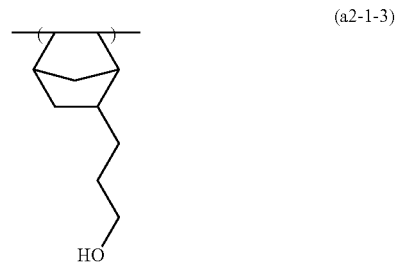

(a2-1-3)

-continued

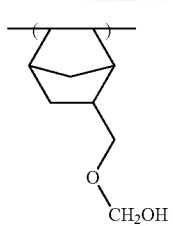
(a2-1-4)

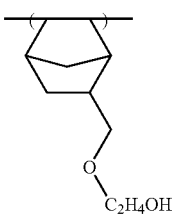
(a2-1-5)

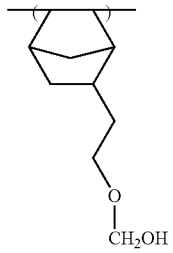
(a2-1-6)

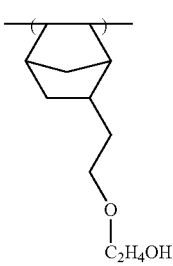
(a2-1-7)

Of these structural units, those represented by the above-mentioned chemical formulas (a2-1-1), (a2-1-2) and (a2-1-3) are preferred.

The structural unit (a210) may be either a single type of structural unit or a mixture of two or more different structural units.

The proportion of the structural unit (a210) within the resin (A1), relative to the combined total of all the structural units that constitute the resin (A1), is preferably within a range from 10 to 50 mol %, more preferably from 15 to 50 mol %, and still more preferably from 20 to 45 mol %. Making this proportion at least as large as the lower limit of the above-mentioned range improves the effects achieved by including the structural unit (a210) such as improving the alkali solubility and making a favorable contrast more readily obtainable. In contrast, by making the proportion no more than the upper limit of the above-mentioned range, a good balance can be achieved with the other structural units.

Structural Unit (a220):

The structural unit (a220) is a structural unit derived from an acrylate ester having a hydroxyl group-containing alkyl group.

The hydroxyl group-containing alkyl group can be broadly classified into a hydroxyl group-containing cyclic alkyl group and a hydroxyl group-containing chain-like alkyl group.

If the structural unit (a220) is a structural unit that includes a hydroxyl group-containing cyclic alkyl group (hereafter abbreviated as "structural unit (a221)"), then the resist pattern swelling suppression effect is further enhanced. Further, the resolution is also improved. Furthermore, favorable levels of contrast and etching resistance are also more readily obtained.

Examples of the structural unit (a221) include those units, amongst the structural units described below in the description of a "structural unit (a22) derived from an acrylate ester containing a hydroxyl group-containing aliphatic cyclic group" that constitutes a resin (A2) described below, in which the aliphatic cyclic group is a saturated hydrocarbon group. Of these structural units, structural units in which the substituent bonded to the α-position of the acrylate ester is a fluorine atom or a fluorinated alkyl group are more preferred, structural units in which this substituent is a fluorinated alkyl group are still more preferred, and structural units in which this substituent is a trifluoromethyl group (—$CF_3$) are most preferred.

If the structural unit (a220) is a structural unit that includes a hydroxyl group-containing chain-like alkyl group (hereafter abbreviated as "structural unit (a222)"), then the hydrophilicity of the entire component (A) is increased, the solubility of the component within an alkali developing solution is enhanced, and the resolution also improves. Further, the controllability of the cross-linking reaction that occurs during resist pattern formation improves, yielding improvements in the pattern shape and the resolution. Moreover, the film density also tends to increase, and this enables suppression of thickness loss during etching, and tends to also improve the heat resistance.

Examples of the structural unit (a222) include those units, amongst the structural units described below in the explanation of a "structural unit (a23) derived from an acrylic acid that has no cyclic structure and has an alcoholic hydroxyl group on a side chain" that constitutes the resin (A2) described below, that include a hydroxyalkyl group. Of these structural units, structural units having a hydroxyalkyl group at the acrylate ester portion are preferred, structural units in which the substituent bonded to the α-position of the acrylate ester is a fluorine atom or a fluorinated alkyl group are more preferred, structural units in which this substituent is a fluorinated alkyl group are still more preferred, and structural units in which this substituent is a trifluoromethyl group (—$CF_3$) are most preferred.

The structural unit (a220) may be either a single type of structural unit or a mixture of two or more different structural units.

The proportion of the structural unit (a220) within the resin (A1), relative to the combined total of all the structural units that constitute the resin (A1), is preferably within a range from 10 to 80 mol %, more preferably from 15 to 60 mol %, and still more preferably from 20 to 55 mol %. Making this proportion at least as large as the lower limit of the above-mentioned range ensures that the effects obtained by including the structural unit (a220) are achieved, whereas by making the proportion no more than the upper limit of the above-mentioned range, a good balance can be achieved with the other structural units.

In those cases where the structural unit (a220) includes both the structural unit (a221) and the structural unit (a222), the mixing ratio between the two structural units, reported as a molar ratio, is preferably such that the structural unit (a221): structural unit (a222) ratio is from 9:1 to 1:9, more preferably from 8:2 to 2:8, and still more preferably from 6:4 to 7:3.

By including the structural unit (a221) and the structural unit (a222) in a favorable balance that satisfies the above-mentioned mixing ratio, a favorable exposure margin can be obtained. Further, a suitable level of contrast is obtained, and the resolution is improved. Moreover, the etching resistance also improves.

Other Structural Units:

In the negative resist composition used in the present invention, besides the structural units (a1) and (a2) described above, the resin (A1) may also include, where appropriate, other structural units typically used in the component (A) of conventional chemically amplified resist compositions.

In the present invention, the resin (A1) is preferably a resin in which the structural units (a1) and (a2) represent the main components.

Here, the term "main components" means that the combined quantity of the structural units (a1) and (a2) represents at least 70 mol %, and preferably 80 mol % or greater, relative to the combined total of all the structural units that constitute the resin (A1). Of the various possibilities, resins formed solely from the structural units (a1) and (a2) are the most desirable.

In the present invention, the combination of the structural unit (a1) and the structural unit (a2) within the resin (A1) is preferably a combination of the structural unit (a1) and the structural unit (a210). Examples of such combinations of structural units include the combinations of structural units represented by chemical formulas (A1-1) to (A1-4) shown below.

[Chemical Formula 5]

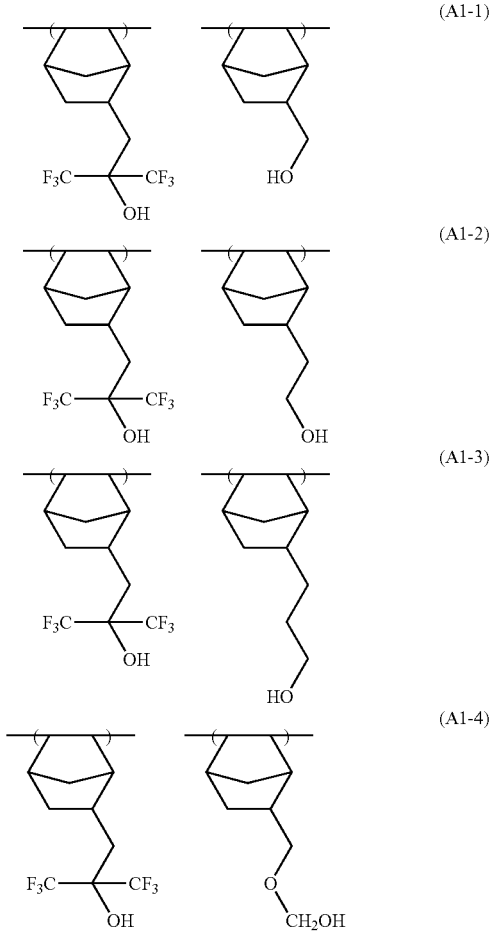

The weight average molecular weight (Mw, the polystyrene equivalent molecular weight measured by gel permeation chromatography) of the resin (A1) is preferably within a range from 2,000 to 10,000, more preferably from 3,000 to 6,000, and most preferably from 3,000 to 5,000. Ensuring that this molecular weight is at least as large as the lower limit of the above-mentioned range enables good contrast to be obtained, whereas ensuring the molecular weight is no more than the upper limit of the above-mentioned range can suppress swelling of the resist pattern. As a result, the resolution can be improved. Further, suppressing swelling of the pattern also yields an improvement in the depth of focus (DOF) properties and improved suppression of line edge roughness (LER). Furthermore, ensuring a weight average molecular weight within the above range is preferred in terms of achieving a large suppression effect on resist pattern swelling. Lower weight average molecular weights within the above-mentioned range tend to yield more favorable properties.

Further, the degree of dispersion (Mw/Mn) is preferably from 1.0 to 5.0, and more preferably from 1.0 to 2.5.

When the resin (A1) is used in the component (A), one type of the resin (A1) may be used alone, or a mixture of two or more types may be used.

In those cases where the resin (A1) is used, the proportion of the resin (A1) within the component (A) is preferably at least 70% by weight, more preferably at least 80% by weight, and is most preferably 100% by weight.

[Resin (A2)]

The resin (A2) includes a structural unit (hereafter, abbreviated as "structural unit (a21)") that contains an aliphatic cyclic group having a fluorinated hydroxyalkyl group.

Further, in addition to the structural unit (a21), the resin (A2) preferably also includes a structural unit (hereafter, abbreviated as structural unit (a22)) derived from an acrylate ester containing a hydroxyl group-containing aliphatic cyclic group.

Furthermore, in addition to the structural unit (a21), or in addition to a combination of the structural unit (a21) and the structural unit (a22), the resin (A2) preferably also includes a structural unit (hereafter, abbreviated as structural unit (a23)) derived from an acrylic acid that has no cyclic structure and has an alcoholic hydroxyl group on a side chain.

Structural Unit (a21):

The structural unit (a21) is a structural unit that includes an aliphatic cyclic group having a fluorinated hydroxyalkyl group. Including the structural unit (a21) improves the solubility in an alkali developing solution. Further, swelling of the resist is suppressed, and lithographic properties such as the pattern shape and LWR are improved.

Examples of the aliphatic cyclic group having a fluorinated hydroxyalkyl group include the same groups as those described above for the structural unit (a1). As the aliphatic cyclic group (prior to the bonding of the fluorinated hydroxyalkyl group), groups in which two hydrogen atoms have been removed from cyclohexane, adamantane, norbornane or tetracyclododecane are readily available industrially, and are consequently preferred.

Of these monocyclic and polycyclic groups described above, a group in which two hydrogen atoms have been removed from norbornane is particularly desirable.

The structural unit (a21) is preferably a structural unit derived from acrylic acid. A structure in which the above-mentioned aliphatic cyclic group is bonded to the oxygen atom (—O—) of the carbonyloxy group [—C(O)O—] of an acrylate ester (namely, a structure in which the hydrogen atom of the carboxyl group of acrylic acid has been substituted with the aliphatic cyclic group) is particularly desirable.

More specifically, as the structural unit (a21), structural units represented by general formula (1) shown below are preferred.

[Chemical Formula 6]

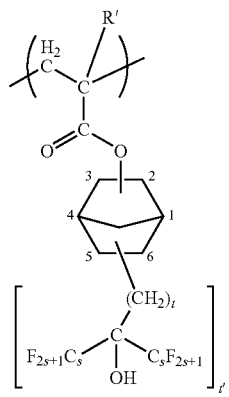

(1)

wherein R' represents a hydrogen atom, an alkyl group or a halogenated alkyl group; and s, t and t' each independently represents an integer of 1 to 5.

In formula (1), R' represents a hydrogen atom, an alkyl group or a halogenated alkyl group.

As the alkyl group for R', a lower alkyl group of 1 to 5 carbon atoms is preferred, and specific examples include a methyl group, an ethyl group, a propyl group, an isopropyl group, an n-butyl group, an isobutyl group, a tert-butyl group, a pentyl group, an isopentyl group or a neopentyl group, and a methyl group is particularly desirable.

The halogenated alkyl group for R' is preferably a lower alkyl group of 1 to 5 carbon atoms in which one or more of the hydrogen atoms have been substituted with fluorine atoms. Specific examples of suitable alkyl groups include the same groups as those listed above. Examples of the halogen atom include a fluorine atom, a chlorine atom, a bromine atom and an iodine atom, and a fluorine atom is particularly desirable. The hydrogen atoms substituted with halogen atoms may represent either some, or all, of the hydrogen atoms that constitute the alkyl group.

In the present invention, R' is preferably a hydrogen atom or an alkyl group, and a hydrogen atom or a methyl group is more preferable in terms of industrial availability.

Each s independently represents an integer of 1 to 5, and is preferably an integer of 1 to 3, and most preferably 1.

t represents an integer of 1 to 5, preferably an integer of 1 to 3, and most preferably 1.

t' represents an integer of 1 to 3, preferably an integer of 1 to 2, and most preferably 1.

In the structural units represented by the aforementioned general formula (1), it is preferable that a 2-norbonyl group or 3-norbonyl group be bonded to the terminal of the carboxyl group of the acrylic acid. The fluorinated alkyl alcohol is preferably bonded to the 5th or 6th position of the norbornyl group.

The structural unit (a21) may be either a single type of structural unit or a mixture of two or more different structural units.

The proportion of the structural unit (a21) within the resin (A2), relative to the combined total of all the structural units that constitute the resin (A2), is preferably within a range from 10 to 90 mol %, more preferably from 20 to 90 mol %, still more preferably from 40 to 90 mol %, and most preferably from 45 to 85 mol %. Making this proportion at least as large as the lower limit of the above-mentioned range ensures that the effects obtained by including the structural unit (a21) are achieved, whereas by making the proportion no more than the upper limit of the above-mentioned range, a good balance can be achieved with the other structural units.

Structural Unit (a22):

In addition to the structural unit (a21), the resin (A2) preferably also includes a structural unit (a22) derived from an acrylate ester containing a hydroxyl group-containing aliphatic cyclic group. When a resin (A2) that includes the structural unit (a22) is blended into the negative resist composition, the hydroxyl group (the alcoholic hydroxyl group) of this structural unit (a22) reacts with the component (C) under the action of the acid generated from the component (B), and this reaction causes the resin (A2) to change from a state that is soluble in the alkali developing solution to a state that is insoluble.

The expression "hydroxyl group-containing aliphatic cyclic group" describes a group in which a hydroxyl group is bonded to an aliphatic cyclic group.

The number of hydroxyl groups bonded to the aliphatic cyclic group is preferably within a range from 1 to 3, and is most preferably 1.

The aliphatic cyclic group may be either a monocyclic or polycyclic group, although a polycyclic group is preferred. Furthermore, an alicyclic hydrocarbon group is preferred. Moreover, a saturated group is preferred. Furthermore, the number of carbon atoms within the aliphatic cyclic group is preferably within a range from 5 to 15.

Specific examples of the aliphatic cyclic group (prior to bonding of the hydroxyl group) include the same aliphatic cyclic groups as those described above in relation to the structural unit (a21).

As the aliphatic cyclic group of the structural unit (a22), of the groups described above, a cyclohexyl group, an adamantyl group, a norbornyl group and a tetracyclododecanyl group are readily available industrially, and are consequently preferred. Of these, a cyclohexyl group or adamantyl group is preferred, and an adamantyl group is particularly preferred.

Besides the hydroxyl group, a linear or branched alkyl group of 1 to 4 carbon atoms may also be bonded to the aliphatic cyclic group.

In the structural unit (a22), the hydroxyl group-containing aliphatic cyclic group is preferably bonded to the ester group (—C(O)O—) of the acrylate ester.

In such cases, in the structural unit (a22), another substituent may be bonded to the α-position (the α-position carbon atom) of the acrylate ester instead of a hydrogen atom. Examples of preferred substituents include an alkyl group and a halogenated alkyl group.

These groups are as described above in relation to the group R' within the general formula (1) of the aforementioned structural unit (a21), and of the various groups that can be bonded to the α-position, a hydrogen atom or an alkyl group is preferred, a hydrogen atom or a methyl group is even more preferred, and a hydrogen atom is the most desirable.

Specific examples of preferred structural units (a22) include structural units represented by general formula (2) shown below.

[Chemical Formula 7]

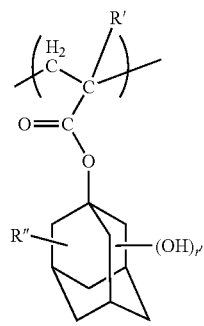

(2)

wherein R' is as defined above; R" represents a hydrogen atom, an alkyl group, or an alkoxy group of 1 to 5 carbon atoms; and r' represents an integer of 1 to 3.

In general formula (2), R' is as defined for R in general formula (1) above.

The alkyl group for R" is as defined above for the alkyl group for R'.

In general formula (2) above, R' and R" are both preferably hydrogen atoms.

r' represents an integer of 1 to 3, and is most preferably 1.

Although there are no particular limitations on the bonding position of the hydroxyl group, structural units in which the hydroxyl group is bonded to the 3rd position of the adamantyl group are preferred.

The structural unit (a22) may be either a single type of structural unit or a mixture of two or more different structural units.

The proportion of the structural unit (a22) within the resin (A2), relative to the combined total of all the structural units that constitute the resin (A2), is preferably within a range from 10 to 70 mol %, more preferably from 10 to 50 mol %, and most preferably from 20 to 40 mol %. Making this proportion at least as large as the lower limit of the above-mentioned range ensures that the effects obtained by including the structural unit (a22) are achieved, whereas by making the proportion no more than the upper limit of the above-mentioned range, a good balance can be achieved with the other structural units.

Structural Unit (a23):

In addition to the structural unit (a21), or in addition to both the structural unit (a21) and the structural unit (a22), the resin (A2) preferably also includes a structural unit (a23) derived from an acrylic acid that has no cyclic structure and has an alcoholic hydroxyl group on a side chain.

When a resin (A2) that includes the structural unit (a23) is blended into the negative resist composition, the alcoholic hydroxyl group of this structural unit (a23) reacts with the component (C), together with the hydroxyl group of the structural unit (a22), under the action of the acid generated from the component (B). Accordingly, the resin (A2) changes more readily from a state that is soluble in an alkali developing solution to a state that is insoluble, which has the effect of improving the lithographic properties such as the resolution. Further, thickness loss can also be suppressed. Furthermore, the controllability of the cross-linking reaction during pattern formation is favorable. Moreover, the film density also tends to increase. As a result, the heat resistance tends to improve. Moreover, the etching resistance also improves.

In the structural unit (a23), the expression "has no cyclic structure" means that the structural unit includes no aliphatic cyclic groups or aromatic groups.

The structural unit (a23) is readily distinguishable from the structural unit (a22) as a result of having no cyclic structure.

Examples of structural units that include an alcoholic hydroxyl group on a side chain include structural units having a hydroxyalkyl group.

Examples of this hydroxyalkyl group include the same hydroxyalkyl groups as those within the "fluorinated hydroxyalkyl group" described above in relation to the structural unit (a21).

The hydroxyalkyl group may, for example, be bonded directly to the α-position carbon atom of the main chain (the portion formed by cleavage of the ethylenic double bond of the acrylic acid), or may form an ester group through substitution of the hydrogen atom of the acrylic acid carboxyl group.

In the structural unit (a23), the hydroxyalkyl group preferably exists at either one, or both of these locations.

In those cases where the hydroxyalkyl group is not bonded to the α-position, the hydrogen atom at the α-position carbon atom may be replaced with an alkyl group or a halogenated alkyl group. Examples of this alkyl group or halogenated alkyl group include the same groups as those described above for R' within general formula (1).

As the structural unit (a23), structural units represented by general formula (3) shown below are preferred.

[Chemical Formula 8]

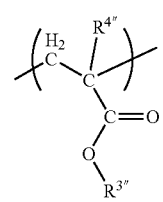

(3)

wherein $R^{4'''}$ represents a hydrogen atom, an alkyl group, a halogenated alkyl group or a hydroxyalkyl group; and $R^{3'''}$ represents a hydrogen atom, an alkyl group or a hydroxyalkyl group, provided that at least one of $R^{4'''}$ and $R^{3'''}$ represents a hydroxyalkyl group.

The hydroxyalkyl group for $R^{4'''}$ is preferably a hydroxyalkyl group of 1 to 10 carbon atoms, is preferably a linear or branched group, is more preferably a hydroxyalkyl group of 2 to 8 carbon atoms, and is most preferably a hydroxymethyl group or hydroxyethyl group.

There are no particular limitations on the number of hydroxyl groups or the bonding positions of those groups, although one hydroxyl group is typical, and the hydroxyl group is preferably bonded to the terminal of the alkyl group.

The alkyl group for $R^{4'''}$ is preferably an alkyl group of 1 to 10 carbon atoms, is more preferably an alkyl group of 2 to 8 carbon atoms, and is most preferably an ethyl group or methyl group.

The halogenated alkyl group for $R^{4'''}$ is preferably a lower alkyl group of 1 to 5 carbon atoms (most preferably an ethyl group or methyl group) in which some or all of the hydrogen atoms have been substituted with halogen atoms. Examples of halogen atoms include fluorine atoms, chlorine atoms, bromine atoms and iodine atoms, and fluorine atoms are particularly desirable.

Examples of the alkyl group and hydroxyalkyl group for $R^{3''}$ include the same groups as the alkyl group and hydroxyalkyl group for $R^{4''}$.

Specific examples of the structural unit represented by general formula (3) include structural units derived from (α-hydroxyalkyl) acrylic acids (not including structural units derived from acrylate esters), structural units derived from alkyl (α-hydroxyalkyl) acrylate esters, and structural units derived from hydroxyalkyl (α-alkyl) acrylate esters.

Of these, including a structural unit derived from an alkyl (α-hydroxyalkyl) acrylate ester as the structural unit (a23) is preferred in terms of improving the film density. Of the various possibilities, structural units derived from ethyl (α-hydroxymethyl) acrylate or methyl (α-hydroxymethyl) acrylate are particularly desirable.

Furthermore, including a structural unit derived from a hydroxyalkyl (α-alkyl) acrylate ester as the structural unit (a23) is preferred in terms of improving the cross-linking efficiency. Of such structural units, structural units derived from hydroxyethyl α-methyl-acrylate or hydroxymethyl α-methyl-acrylate are particularly desirable.

The structural unit (a23) may be either a single type of structural unit or a mixture of two or more different structural units.

The proportion of the structural unit (a23) within the resin (A2), relative to the combined total of all the structural units that constitute the resin (A2), is preferably within a range from 5 to 50 mol %, more preferably from 5 to 40 mol %, still more preferably from 5 to 30 mol %, and most preferably from 10 to 25 mol %. Making this proportion at least as large as the lower limit of the above-mentioned range ensures that the effects obtained by including the structural unit (a23) are achieved, whereas by making the proportion no more than the upper limit of the above-mentioned range, a good balance can be achieved with the other structural units.

Other Structural Units:

Besides each of the structural units (a21) to (a23) described above, the resin (A2) may also include other copolymerizable structural units.

As such structural units, any of the structural units used in known resin components of conventional chemically amplified resist compositions can be used. An example is a structural unit (a24) derived from an acrylate ester that includes a lactone-containing monocyclic or polycyclic group.

The structural unit (a24) may be either a single type of structural unit or a mixture of two or more different structural units.

If the structural unit (a24) is included in the resin (A2), then the proportion of the structural unit (a24) within the resin (A2), relative to the combined total of all the structural units that constitute the resin (A2), is preferably within a range from 10 to 70 mol %, more preferably from 10 to 40 mol %, and most preferably from 10 to 25 mol %. Making this proportion at least as large as the lower limit of the above-mentioned range ensures that the effects obtained by including the structural unit (a24) are achieved, whereas by making the proportion no more than the upper limit of the above-mentioned range, a good balance can be achieved with the other structural units.

The resin (A2) is preferably a resin in which the structural units (a21) to (a23) represent the main components.

Here, the term "main components" means that the combined quantity of the structural units (a21) to (a23) represents at least 50 mol %, preferably at least 70 mol %, more preferably at least 80 mol %, and most preferably 100 mol %, of all the structural units. In other words, it is particularly desirable that the resin (A2) be a resin composed of the structural unit (a21), structural unit (a22) and structural unit (a23).

The weight average molecular weight (Mw, the polystyrene equivalent molecular weight measured by gel permeation chromatography) of the resin (A2) is preferably within a range from 2,000 to 30,000, more preferably from 2,000 to 10,000, and most preferably from 3,000 to 8,000. Ensuring a molecular weight within this range is preferred in terms of obtaining a favorable dissolution rate within an alkali developing solution, and achieving a high level of resolution. For the weight average molecular weight, lower values within the above-mentioned range tend to yield more favorable properties.

Further, the degree of dispersion (Mw/Mn) is preferably from 1.0 to 5.0, and more preferably from 1.0 to 2.5.

When the resin (A2) is used in the component (A), one type of the resin (A2) may be used alone, or a mixture of two or more types may be used.

In those cases where the resin (A2) is used, the proportion of the resin (A2) within the component (A) is preferably at least 50% by weight, more preferably at least 70% by weight, still more preferably at least 80% by weight, and is most preferably 100% by weight.

The component (A) that uses resins such as the resin (A1) and resin (A2) can be synthesized, for example, by a method in which the monomers that give rise to each of the structural units are subjected to a radical polymerization using normal methods, or the method disclosed in International Patent Publication 2004/076495 pamphlet.

Besides the resin (A1) and the resin (A2), the component (A) may also use other polymeric compounds used within conventional negative resist compositions (such as hydroxystyrene resins, novolak resins or acrylic resins).

In the present invention, as the component (A), a low molecular weight compound that is soluble in an alkali developing solution (hereafter, referred to as "component (A3)") may be used.

As the component (A3), a low molecular compound is preferable, which has a molecular weight of at least 500 and less than 4,000, and contains a hydrophilic group. Specific examples include compounds containing a plurality of phenol skeletons.

Preferred examples of the component (A3) include low molecular weight phenolic compounds that are known, for example, as sensitizers or heat resistance improvers for use in non-chemically amplified g-line or i-line resists, and any of these compounds may be used.

Examples of the low molecular weight phenolic compounds include bisphenol type compounds such as bis(4-hydroxyphenyl)methane, bis(2,3,4-trihydroxyphenyl)methane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(2,3-dihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, and 2-(2,3,4-trihydroxyphenyl)-2-(4'-hydroxy-3',5'-dimethylphenyl)propane; tris-phenol type compounds such as tris(4-hydroxyphenyl)methane, bis(4-hydroxy-3-methylphenyl)-2-hydroxyphenylmethane, bis(4-hydroxy-2,3,5- trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, and bis(5-cyclohexyl-4-hydroxy-2-methylphenyl)-3,4-dihydroxyphenylmethane; linear three benzene ring type phenolic compounds such as 2,4-bis(3,5-dimethyl-4-hydroxybenzyl)-5-hydroxyphenol, and 2,6-bis(2,5-dimethyl-4-hydroxybenzyl)-4-methylphenol; linear four benzene ring type phenolic compounds such as 1,1-bis[3-(2-hydroxy-5-methylbenzyl)-4-hydroxy-5-cyclohexylphenyl]isopropane, bis[2,5-dimethyl-3-(4-hydroxy-5-methylbenzyl)-4-hydroxyphenyl]methane, bis [2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, and bis[2,5-dimethyl-3-(2-hydroxy-5-methylbenzyl)-4-hydroxyphenyl]methane; linear polyphenol compounds including linear five benzene ring type phenolic compounds such as 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, and 2,6-bis[2,5-dimethyl-3-(2-hydroxy-5-methylbenzyl)-4-hydroxybenzyl]-4-methylphenol; polynuclear branched compounds such as 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene; and 2 to 12 benzene ring type formalin condensation products of phenols such as phenol, m-cresol, p-cresol and xylenol. Needless to say, the low molecular weight phenolic compound is not limited to these examples.

As the component (A), one type may be used alone, or two or more types may be used in combination.

The component (A) preferably includes the resin (A1).

The quantity of the component (A) within the negative resist composition may be adjusted in accordance with the resist film thickness that is to be formed.

[Component (B)]

As the component (B), any materials can be appropriately selected from those which have been conventionally known as acid generators for a chemically amplified resist. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators; and disulfone-based acid generators.

As an onium salt-based acid generator, a compound represented by general formula (b-1) or (b-2) shown below can be used.

[Chemical Formula 9]

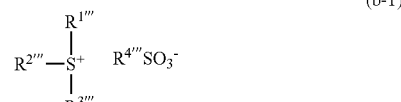

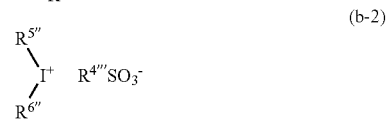

wherein $R^{1'''}$ to $R^{3'''}$, $R^{5''}$ and $R^{6''}$ each independently represents an aryl group or alkyl group, wherein two of $R^{1'''}$ to $R^{3'''}$ in formula (b-1) may be bonded to each other to form a ring with the sulfur atom in the formula; and $R^{4'''}$ represents an alkyl group, a halogenated alkyl group, an aryl group or an alkenyl group which may have a substituent, with the proviso that at least one of $R^{1'''}$ to $R^{3'''}$ represents an aryl group, and at least one of $R^{5''}$ and $R^{6''}$ represents an aryl group.

In general formula (b-1), $R^{1'''}$ to $R^{3'''}$ each independently represents an aryl group or an alkyl group. Two of $R^{1'''}$ to $R^{3'''}$ in general formula (b-1) may be bonded to each other to form a ring with the sulfur atom in the formula.

Further, among $R^{1'''}$ to $R^{3'''}$, at least one group represents an aryl group. Among $R^{1'''}$ to $R^{3'''}$, two or more groups are preferably aryl groups, and it is particularly desirable that all of $R^{1'''}$ to $R^{3'''}$ are aryl groups.

The aryl group for $R^{1'''}$ to $R^{3'''}$ is not particularly limited. For example, an aryl group having 6 to 20 carbon atoms may be used in which some or all of the hydrogen atoms of the aryl group may or may not be substituted with alkyl groups, alkoxy groups, halogen atoms, hydroxyl groups, alkoxyalkyloxy groups or alkoxycarbonylalkyloxy groups.

The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

Examples of the alkoxyalkyloxy group, with which hydrogen atoms of the aryl group may be substituted, include a group represented by general formula: —O—C($R^{47}$)($R^{48}$)—O—$R^{49}$ [wherein each of $R^{47}$ and $R^{48}$ independently represents a hydrogen atom or a linear or branched alkyl group; and $R^{49}$ represents an alkyl group].

The alkyl group for $R^{47}$ and $R^{48}$ preferably has 1 to 5 carbon atoms, and may be either linear or branched, and is preferably an ethyl group or a methyl group, and most preferably a methyl group.

It is preferable that at least one of $R^{47}$ and $R^{48}$ be a hydrogen atom, and it is particularly desirable that either one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, and which may or may not be substituted with alkyl groups of 1 to 5 carbon atoms, fluorine atoms or fluorinated alkyl groups. Examples of the monocycloalkane include cyclopentane and cyclohexane. Examples of the polycycloalkane include adamantane, norbornane, isobornane, tricyclodecane and tetracyclododecane. Of these, a group in which one or more hydrogen atoms have been removed from adamantane is preferable.

Examples of the alkoxycarbonylalkyloxy group, with which hydrogen atoms of the aryl group may be substituted, include a group represented by general formula: —O—$R^{50}$—C(=O)—O—$R^{51}$ [wherein $R^{50}$ represents a linear or branched alkylene group; and $R^{51}$ represents a tertiary alkyl group].

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

Examples of tertiary alkyl groups for $R^{51}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

The alkyl group for $R^{1'''}$ to $R^{3'''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

When two of $R^{1'''}$ to $R^{3'''}$ in formula (b-1) are bonded to each other to form a ring with the sulfur atom shown in the formula, it is preferable that the two of $R^{1'''}$ to $R^{3'''}$ form a 3- to 10-membered ring including the sulfur atom, and it is particularly desirable that the two of $R^{1'''}$ to $R^{3'''}$ form a 5- to 7-membered ring including the sulfur atom.

When two of $R^{1'''}$ to $R^{3'''}$ in formula (b-1) are bonded to each other to form a ring with the sulfur atom shown in the formula, the remaining one of $R^{1'''}$ to $R^{3'''}$ is preferably an aryl group. As examples of the aryl group, the same as the above-mentioned aryl groups for $R^{1'''}$ to $R^{3'''}$ can be exemplified.

$R^{4'''}$ represents an alkyl group, a halogenated alkyl group, an aryl group or an alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4'''}$, a group in which part of or all of the hydrogen atoms of the aforementioned linear, branched or cyclic alkyl group have been substituted with halogen atoms can be given. Examples of the halogen atom include a fluorine atom, a chlorine atom, a bromine atom and an iodine atom, and a fluorine atom is particularly desirable.

In the halogenated alkyl group, the ratio of the number of halogen atoms relative to the combined total of halogen atoms and hydrogen atoms within the halogenated alkyl group (namely, the halogenation ratio (%)) is preferably 10 to 100%, more preferably 50 to 100%, and is most preferably 100%. Higher halogenation ratios are preferred, as they result in increased acid strength.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to R4''', the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by formula: X-$Q^1$-[wherein $Q^1$ represents a divalent linking group containing an oxygen atom; and X represents a hydrocarbon group of 3 to 30 carbon atoms which may have a substituent].

Examples of halogen atoms and alkyl groups as substituents for $R^{4'''}$ include the same halogen atoms and alkyl groups as those described above with respect to the halogenated alkyl group for $R^{4'''}$.

Examples of the hetero atom include an oxygen atom, a nitrogen atom, and a sulfur atom.

In the group represented by formula X-$Q^1$-, $Q^1$ represents a divalent linking group containing an oxygen atom.

$Q^1$ may contain an atom other than an oxygen atom. Examples of the atom other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amide bond (—C(=O)—NH—), a carbonyl group (—C(=O)—) and a carbonate group (—O—C(=O)—O—); and combinations of the aforementioned non-hydrocarbon, oxygen atom-containing linking groups with an alkylene group.

Specific examples of the combinations of the aforementioned non-hydrocarbon, oxygen atom-containing linking groups and an alkylene group include —$R^{91}$—O—, —$R^{92}$—O—C(=O)— and —C(=O)—O—$R^{93}$—O—C(=O)— (wherein each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of the alkylene group include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2$$CH_2$—, —CH($CH_2CH_3$)$CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

As $Q^1$, a divalent linking group containing an ester bond or an ether bond is preferable, and a group —$R^{91}$—O—, —$R^{92}$—O—C(=O)— or —C(=O)—O—$R^{93}$—O—C(=O)— is particularly desirable.

In the group represented by formula X-$Q^1$-, the hydrocarbon group for X may be either an aromatic hydrocarbon group or an aliphatic hydrocarbon group.

An aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of the aromatic hydrocarbon group include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an arylalkyl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 to 2 carbon atoms, and most preferably 1 carbon atom.

The aromatic hydrocarbon group may have a substituent. For example, a part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group as the substituent for the aromatic hydrocarbon group include a group in which a part of or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be any of linear, branched or cyclic.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" for X, there is no particular limitation as long as it is an atom other than a carbon atom and a hydrogen atom, and examples thereof include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting a part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)2-O—. When the aliphatic hydrocarbon group is cyclic, the aliphatic hydrocarbon group may contain these substituent groups in the ring structure.

Examples of the substituent group for substituting a part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Examples of the aforementioned halogenated alkyl group include a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 10]

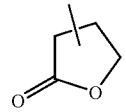
(L1)

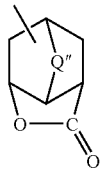
(L2)

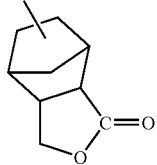
(L3)

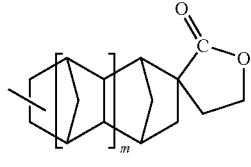
(L4)

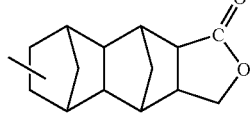
(L5)

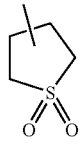
(S1)

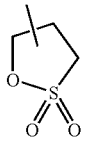
(S2)

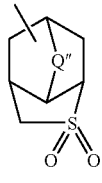
(S3)

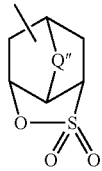
(S4)

wherein Q" represents an alkylene group of 1 to 5 carbon atoms, —O—, —S—, —O—R$^{94}$— or —S—R$^{95}$— (wherein each of $R^{94}$ and $R^{95}$ independently represents an alkylene group of 1 to 5 carbon atoms); and m represents an integer of 0 or 1.

In the above formula, as the alkylene group for Q", $R^{94}$ and $R^{95}$, the same alkylene groups as those described above for $R^{91}$ to $R^{93}$ can be used.

In these aliphatic cyclic groups, a part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the aforementioned substituent groups for substituting a part or all of the hydrogen atoms can be used.

In the present invention, X is preferably a cyclic group which may have a substituent. The cyclic group may be either an aromatic hydrocarbon group which may have a substituent or an aliphatic cyclic group which may have a substituent, and an aliphatic cyclic group which may have a substituent is preferable.

The aromatic hydrocarbon group is preferably a naphthyl group which may have a substituent or a phenyl group which may have a substituent.

As the aliphatic cyclic group which may have a substituent, an aliphatic polycyclic group which may have a substituent is preferable. As the aliphatic polycyclic group, the above-mentioned group in which one or more hydrogen atoms have been removed from a polycycloalkane, and the above-mentioned groups represented by formulas (L2) to (L5), (S3) and (S4) are preferable.

In the present invention, $R^{4'''}$ preferably has a group represented by formula X-$Q^1$- as a substituent. In this case, $R^{4'''}$ is preferably a group represented by formula X-$Q^1$-$Y^1$- [wherein $Q^1$ and X are the same as defined above; and $Y^1$ represents an alkylene group of 1 to 4 carbon atoms which may have a substituent, or a fluorinated alkylene group of 1 to 4 carbon atoms which may have a substituent].

In the group represented by the formula X-$Q^1$-$Y^1$—, as the alkylene group for $Y^1$, the same alkylene group as those described above for $Q^1$ in which the number of carbon atoms is 1 to 4 can be used.

As the fluorinated alkylene group for $Y^1$, groups in which part of or all of the hydrogen atoms in the alkylene group are substituted with fluorine atoms can be used.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—, —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Among these, —$CF_2$—, —$CF_2CF_2$—, —$CF_2CF_2CF_2$—, and $CH_2CF_2CF_2$— are preferable, —$CF_2$—, —$CF_2CF_2$— and —$CF_2CF_2CF_2$— are more preferable, and —$CF_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group have been substituted with atoms or groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

Specific examples of the groups $R^{4'''}$—$SO_3^-$ in which $R^{4'''}$ is a group represented by formula X-$Q^1$-$Y^1$- include those represented by formulas (b1) to (b7) shown below.

[Chemical Formula 11]

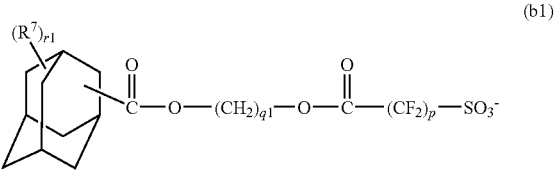

(b1)

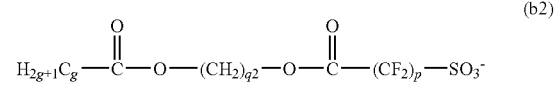

(b2)

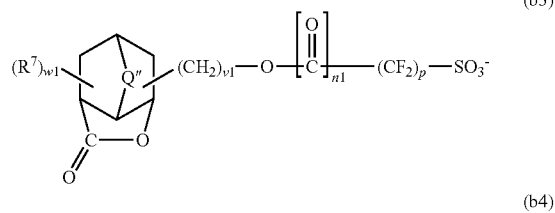

(b3)

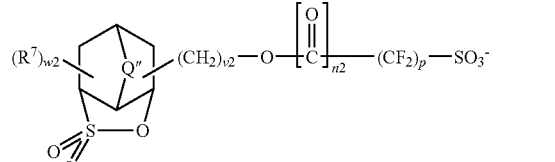

(b4)

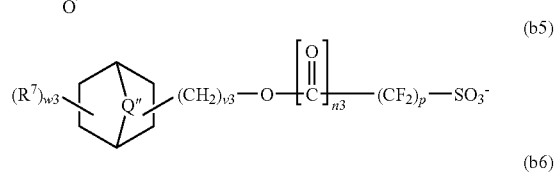

(b5)

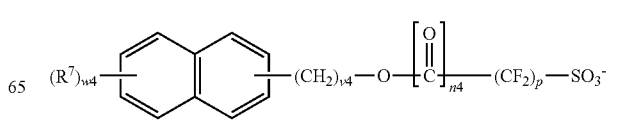

(b6)

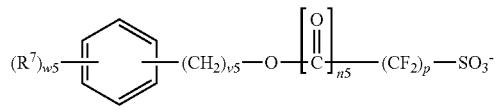
(b7)

wherein p represents an integer of 1 to 3; each of q1 and q2 independently represents an integer of 1 to 5; r1 represents an integer of 0 to 3; g represents an integer of 1 to 20; $R^7$ represents a substituent; each of n1 to n5 independently represents 0 or 1; each of v1 to v5 independently represents an integer of 0 to 3; each of w1 to w5 independently represents an integer of 0 to 3; and Q" is as defined above.

As the substituent for $R^7$, the same groups as those which the aforementioned aliphatic hydrocarbon group or aromatic hydrocarbon group for X may have as a substituent can be used.

When the subscripts of $R^7$ (namely, r1, and w1 to w5) represent an integer of 2 or more, the plurality of $R^7$ groups in the compound may be the same or different from each other.

Further, other suitable examples of $R^{4'''}$ include a hydrocarbon group of 1 to 12 carbon atoms which may have a substituent (with the proviso that the carbon atom bonded to the sulfur atom within —$SO_3^-$ has no fluorine atom bonded thereto). In other words, as an anion moiety for compounds represented by general formula (b-1) or (b-2) shown above, $R^0$—$SO_3^-$ [wherein $R^0$ represents a hydrocarbon group of 1 to 12 carbon atoms which may have a substituent, with the proviso that the carbon atom bonded to the sulfur atom within —$SO_3^-$ has no fluorine atom bonded thereto] is preferable.

The hydrocarbon group for $R^0$ may or may not have a substituent, with the proviso that the carbon atom bonded to the sulfur atom within —$SO_3^-$ has no fluorine atom bonded thereto.

The substituent preferably contains no fluorine atom, and examples thereof include a lower alkyl group of 1 to 5 carbon atoms, and an oxygen atom (=O).

The hydrocarbon group of 1 to 12 carbon atoms for $R^0$ may be either an aliphatic hydrocarbon group or an aromatic hydrocarbon group. More specifically, as the aliphatic hydrocarbon group and aromatic hydrocarbon group, the same aliphatic hydrocarbon group and aromatic hydrocarbon group as those described above for X can be used.

When $R^0$ represents an aliphatic hydrocarbon group, the aliphatic hydrocarbon group is preferably a linear or branched alkyl group, or a cyclic hydrocarbon group.

Specific examples of the group $R^0$—$SO_3^-$ in which $R^0$ represents a linear or branched alkyl group include a group represented by formula $C_aH_{2a+1}SO_3^-$. In the above formula, a represents an integer of 1 to 10, and is preferably an integer of 1 to 8. Specific examples of the sulfonic acid ions include a methanesulfonate ion, an ethanesulfonate ion, an n-propanesulfonate ion, an n-butanesulfonate ion and an n-octanesulfonate ion.

Specific examples of the groups $R^0$—$SO_3^-$ in which $R^0$ represents a cyclic hydrocarbon group include those represented by general formulas (b8-2-1) to (b8-2-7) shown below.

[Chemical Formula 12]

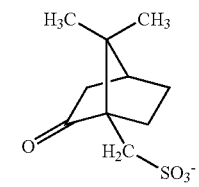
(b8-2-1)

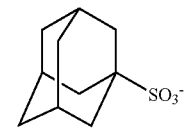
(b8-2-2)

(b8-2-3)

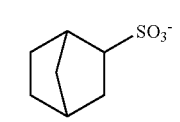

(b8-2-4)

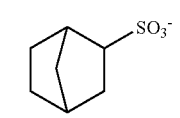

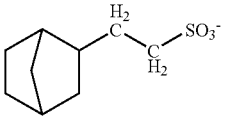
(b8-2-5)

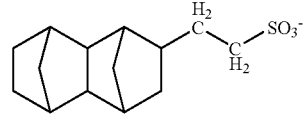
(b8-2-6)

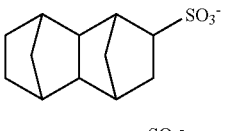
(b8-2-7)

In general formula (b-2), $R^{5'''}$ and $R^{6'''}$ each independently represents an aryl group or an alkyl group. At least one of $R^{5'''}$ and $R^{6'''}$ represents an aryl group. It is preferable that both of $R^{5'''}$ and $R^{6'''}$ represent an aryl group.

As the aryl group for $R^{5'''}$ and $R^{6'''}$, the same as the aryl groups for $R^{1'''}$ to $R^{3'''}$ can be used.

As the alkyl group for $R^{5'''}$ and $R^{6'''}$, the same as the alkyl groups for $R^{1'''}$ to $R^{3'''}$ can be used.

It is particularly desirable that both of $R^{5'''}$ and $R^{6'''}$ represents a phenyl group.

As $R^{4'''}$ in formula (b-2), the same groups as those mentioned above for $R^{4'''}$ in formula (b-1) can be used.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by alkylsulfonates such as methanesulfonate, n-propanesulfonate, n-butanesulfonate, or n-octanesulfonate.

Furthermore, onium salts in which the anion moiety of these onium salts are replaced by an anion moiety represented by any one of formulas (b1) to (b7) and (b8-2-1) to (b8-2-7) shown above can also be used.

Further, onium salt-based acid generators in which the anion moiety in general formula (b-1) or (b-2) shown above is replaced by an anion moiety represented by general formula (b-3) or (b-4) shown below (the cation moiety is the same as (b-1) or (b-2)) may also be used.

[Chemical Formula 13]

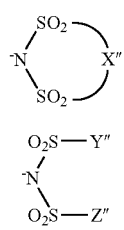

(b-3)

(b-4)

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more preferable since the solubility in a resist solvent is improved.

Further, in the alkylene group for X" or the alkyl group for Y" and Z", it is preferable that the number of hydrogen atoms substituted with fluorine atoms be as large as possible because the acid strength increases and the transparency to high energy radiation of 200 nm or less or electron beam is improved. The percentage of the fluorine atoms within the alkylene group or alkyl group, i.e., the fluorination ratio is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may also be used.

[Chemical Formula 14]

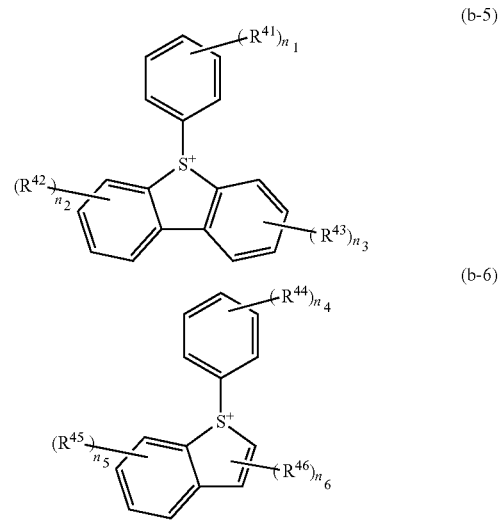

wherein $R^{41}$ to $R^{46}$ each independently represents an alkyl group, an acetyl group, an alkoxy group, a carboxyl group, a hydroxyl group or a hydroxyalkyl group; $n_1$ to $n_5$ each independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert-butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

When the subscripts $n_1$ to $n_6$ of $R^{41}$ to $R^{46}$ represent an integer of 2 or more, the plurality of $R^{41\ to\ R46}$ may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties as those used within previously proposed onium salt-based acid generators may be used. Examples of such anion moieties include fluorinated alkylsulfonate ions such as anion moieties ($R^{4'''}SO_3^-$) for onium salt-based acid generators represented by general formula (b-1) or (b-2) shown above; and anion moieties represented by general formula (b-3) or (b-4) shown above. Among these, a fluorinated alkylsufonate ion is preferable, a fluorinated alkylsufonate ion of 1 to 4 carbon atoms is more preferable, and a linear perfluoroalkylsulfonate ion of 1 to 4 carbon atoms is particularly desirable. Specific examples thereof include a trifluoromethylsulfonate ion, a heptafluoro-n-propylsulfonate ion and a nonafluoro-n-butyl-sulfonate ion.

In the present description, an oxime sulfonate-based acid generator is a compound having at least one group represented by general formula (B-1) shown below, and has a feature of generating acid by irradiation. Such oxime sulfonate-based acid generators are widely used for a chemically amplified resist composition, and can be appropriately selected.

[Chemical Formula 15]

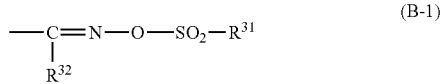

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "have a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$ described above.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 16]

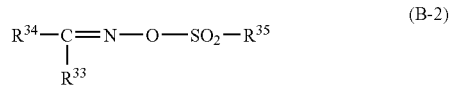

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 17]

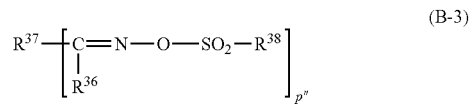

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2) shown above, the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, and still more preferably 90% or more. A completely fluorinated alkyl group in which 100% of the hydrogen atoms are substituted with fluorine atoms is particularly desirable.

In general formula (B-3) shown above, the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same alkyl groups having no substituent or the halogenated alkyl groups mentioned above for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferred examples, the following can be mentioned.

[Chemical Formula 18]

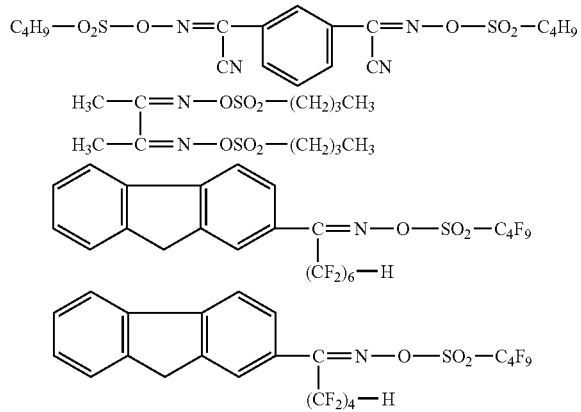

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B), one type of these acid generators may be used alone, or two or more types may be used in combination.

The amount used of the component (B) is 1 to 20 parts by weight, and preferably 2 to 10 parts by weight, relative to 100 parts by weight of the component (A). By ensuring that the amount of the component (B) is at least as large as the lower limit of the above-mentioned range, formation of a resist pattern can be satisfactorily performed. On the other hand, by ensuring that the amount of the component (B) is no more than the upper limit of the above-mentioned range, a uniform solution can be readily obtained and the storage stability becomes satisfactory.

[Component (C)]

There are no particular limitations on the component (C), which may be selected appropriately from the various cross-linking agents used within conventional chemically amplified negative resist compositions.

Specific examples include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bis(hydroxymethyl)norbornane, cyclohexane dimethanol, 3,4,8(or 9)-trihydroxytricyclodecane, 2-methyl-2-adamantanol, 1,4-dioxane-2,3-diol, and 1,3,5-trihydroxycyclohexane.

Furthermore, other suitable examples include compounds produced by reacting an amino group-containing compound such as melamine, acetoguanamine, benzoguanamine, urea, ethylene urea, propylene urea or glycoluril with either formaldehyde or a combination of formaldehyde and a lower alcohol of 1 to 5 carbon atoms, thereby substituting the hydrogen atoms of the amino group with hydroxymethyl groups or lower alkoxymethyl groups of 1 to 5 carbon atoms.

Of these, compounds that use melamine are referred to as melamine-based cross-linking agents, compounds that use urea are referred to as urea-based cross-linking agents, compounds that use an alkylene urea such as ethylene urea or propylene urea are referred to as alkylene urea-based cross-linking agents, and compounds that use glycoluril are referred to as glycoluril-based cross-linking agents.

As the component (C), at least one type of cross-linking agent selected from the group consisting of melamine-based cross-linking agents, urea-based cross-linking agents, alkylene urea-based cross-linking agents, and glycoluril-based cross-linking agents is preferred, and a glycoluril-based cross-linking agent is particularly desirable.

Examples of the melamine-based cross-linking agents include compounds obtained by reacting melamine with formaldehyde, thereby substituting the hydrogen atoms of the amino group with hydroxymethyl groups, and compounds obtained by reacting melamine with formaldehyde and a lower alcohol of 1 to 5 carbon atoms, thereby substituting the hydrogen atoms of the amino group with lower alkoxymethyl groups of 1 to 5 carbon atoms. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of the urea-based cross-linking agents include compounds obtained by reacting urea with formaldehyde, thereby substituting the hydrogen atoms of the amino group with hydroxymethyl groups, and compounds obtained by reacting urea with formaldehyde and a lower alcohol of 1 to 5 carbon atoms, thereby substituting the hydrogen atoms of the amino group with lower alkoxymethyl groups of 1 to 5 carbon atoms. Specific examples include bismethoxymethylurea, bisethoxymethylurea, bispropoxymethylurea and bisbutoxymethylurea, and of these, bismethoxymethylurea is preferred.

Examples of the alkylene urea-based cross-linking agents include compounds represented by general formula (c1'-1) shown below.

[Chemical Formula 19]

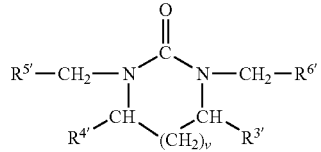

(c1'-1)

wherein $R^{5'}$ and $R^{6'}$ each independently represents a hydroxyl group or a lower alkoxy group; $R^{3'}$ and $R^{4'}$ each independently represents a hydrogen atom, a hydroxyl group or a lower alkoxy group; and v represents 0 or an integer of 1 to 2.

The lower alkoxy group for $R^{5'}$ and $R^{6'}$ may be either a linear or branched group, and is preferably an alkoxy group of 1 to 4 carbon atoms. $R^{5'}$ and $R^{6'}$ may be either the same or different, and are preferably the same.

The lower alkoxy group for $R^{3'}$ and $R^{4'}$ may be either a linear or branched group, and is preferably an alkoxy group of 1 to 4 carbon atoms. $R^{3'}$ and $R^{4'}$ may be either the same or different, and are preferably the same.

v is either 0 or an integer of 1 or 2, and is preferably 0 or 1.

As the alkylene urea-based cross-linking agent, compounds in which v is 0 (ethylene urea-based cross-linking agents) and/or compounds in which v is 1 (propylene urea-based cross-linking agents) are preferred.

Compounds represented by the general formula (c1'-1) above can be obtained by a condensation reaction between an alkylene urea and formalin, and by further reacting the resulting product with a lower alcohol of 1 to 5 carbon atoms.

Specific examples of the alkylene urea-based cross-linking agents include ethylene urea-based cross-linking agents such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linking agents such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linking agents include glycoluril derivatives in which the N-position is substituted with either one or both of a hydroxyalkyl group and an alkoxyalkyl group of 1 to 4 carbon atoms. These glycoluril derivatives can be obtained by a condensation reaction between glycoluril and formalin, and by further reacting the resulting product with a lower alcohol of 1 to 5 carbon atoms.

Specific examples of glycoluril-based cross-linking agents include mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril.

As the component (C), one type of cross-linking agent may be used alone, or two or more types may be used in combination.

The quantity of the component (C) is preferably within a range from 1 to 50 parts by weight, more preferably from 3 to 30 parts by weight, still more preferably from 3 to 15 parts by weight, and most preferably from 5 to 10 parts by weight, relative to 100 parts by weight of the component (A). By ensuring that the quantity of the component (C) is at least as large as the lower limit of the above-mentioned range, cross-linking can be successfully achieved, and a favorable resist pattern with minimal swelling can be obtained. On the other hand, by ensuring that the quantity is not more than the upper limit of the above-mentioned range, the storage stability of the resist coating liquid improves, and deterioration over time in terms of the sensitivity can be suppressed.

[Optional Component]

In the negative resist composition, in order to improve factors such as the resist pattern shape and the post exposure stability of the latent image formed by the pattern-wise exposure of the resist layer, a nitrogen-containing organic compound (D) (hereafter referred to as "component (D)") can be added as an optional component.

A multitude of these components (D) have already been proposed, and any of these known compounds may be used, although a cyclic amine, an aliphatic amine, and particularly a secondary aliphatic amine or tertiary aliphatic amine is preferable. Here, an aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of 1 to 12 carbon atoms (that is, alkylamines or alkyl alcohol amines). Specific examples thereof include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane. As the component (D), one type may be used alone, or two or more types may be used in combination.

The component (D) is typically used in an amount within a range from 0.01 to 5.0 parts by weight, relative to 100 parts by weight of the component (A).

Furthermore, in the negative resist composition, for preventing any deterioration in sensitivity, and improving the resist pattern shape and the post exposure stability of the latent image formed by the pattern-wise exposure of the resist layer, at least one compound (E) (hereafter referred to as "component (E)") selected from the group consisting of organic carboxylic acids and phosphorus oxo acids and derivatives thereof can be added as an optional component.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

If desired, other miscible additives can also be added to the negative resist composition. Examples of such miscible additives include additive resins for improving the performance of the resist film, surfactants for improving the applicability, dissolution inhibitors, plasticizers, stabilizers, colorants, halation prevention agents, and dyes.

[Component (S)]

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone;

ketones such as acetone, methyl ethyl ketone, cyclohexanone, methyl-n-pentyl ketone, methyl isopentyl ketone, and 2-heptanone;

polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate;

polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable);

cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These organic solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably within the range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former: latter) of such a mixed solvent is preferably from 70:30 to 95:5.

The amount of the component (S) is not particularly limited, and is adjusted appropriately to a concentration that enables application of a coating solution to a substrate in accordance with the thickness of the coating film. In general, the organic solvent is used in an amount that yields a solid content for the resist composition that is within a range from 2 to 20% by weight, and preferably from 5 to 15% by weight.

EXAMPLES

As follows is a detailed description of the present invention based on a series of examples, although the scope of the present invention is by no way limited by these examples.

Production Examples 1 and 2

The components shown below in Table 1 were mixed together and dissolved to prepare a negative resist composition 1 and a positive resist composition 1.

TABLE 1

| | Component (A) | Component (B) | | Component (C) | Component (D) | Component (S) |
| --- | --- | --- | --- | --- | --- | --- |
| Negative resist composition 1 | (A)-1 [100] | (B)-1 [3.0] | (B)-2 [6.0] | (C)-1 [8.5] | (D)-1 [1.4] | (S)-1 [2,400] |
| Positive resist composition 1 | (A)-2 [100] | (B)-3 [4.3] | — | — | (D)-2 [0.1] | (S)-2 [2,120] |

The meanings of the abbreviations used in Table 1 are as shown below. The numerical values within the brackets [ ] represent blend quantities (parts by weight).

(A)-1: a polymeric compound represented by chemical formula (A1-1) shown below (manufactured by Promerus LLC). In the polymeric compound (A)-1, the ratio between the structural units (a1:a2, molar ratio), the weight average molecular weight (Mw) and the dispersity (Mw/Mn) are as shown below.

(A)-2: a polymeric compound represented by chemical formula (A)-2 shown below.

[Chemical Formula 20]

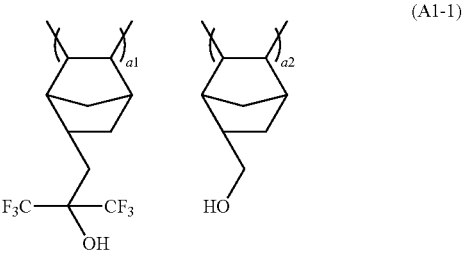

(A1-1)

[a1:a2=60:40 (molar ratio), Mw: 3,600, Mw/Mn: 1.48]

[Chemical Formula 21]

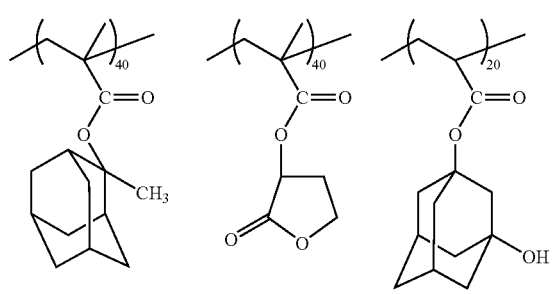

(A)-2

[In the formula, the subscript numerals shown to the bottom right of the parentheses ( ) indicate the molar ratio, Mw: 7,000, Mw/Mn: 1.5]

(B)-1: triphenylsulfonium heptafluoro-n-propanesulfonate.

(B)-2: a compound represented by chemical formula (B-2) shown below.

[Chemical Formula 22]

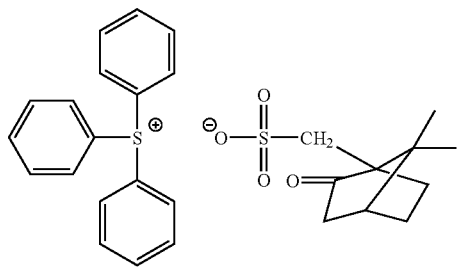

(B-2)

(B)-3: triphenylsulfonium nonafluoro-n-butane sulfonate.
(C)-1: tetraethoxymethylated glycoluril (a product name: E-9401, manufactured by Sanwa Chemical Co., Ltd.).
(D)-1: triisopropanolamine.
(D)-2: triethanolamine.
(S)-1: a mixed solvent of PGMEA/PGME=6/4 (weight ratio).
(S)-2: a mixed solvent of PGMEA/EL=8/2 (weight ratio).

Test Example 1

The present Test Example was conducted in order to examine photomasks and illumination conditions to be used suitably in Example 1 described later.

An organic antireflection film composition (product name: ARC29A, manufactured by Brewer Science Ltd.) was applied onto an 12-inch silicon wafer using a spinner, and the composition was then baked and dried on a hotplate at 205° C. for 60 seconds, thereby forming an organic antireflection film having a film thickness of 85 nm. Then, the negative resist composition 1 obtained above was applied onto the organic antireflection film using a spinner, and was then prebaked (PAB) on a hotplate at 90° C. for 60 seconds and dried, thereby forming a resist film having a film thickness of 100 nm.

Subsequently, the resist film was selectively irradiated (exposure dose: 30 mJ/cm$^2$) with an ArF excimer laser (193 nm) under specified illumination conditions through a specified photomask, using an ArF exposure apparatus Nikon NSR-S308F (manufactured by Nikon Corporation, NA (numerical aperture)=0.92). The illumination conditions and combinations of photomasks used (i.e., conditions 1 to 5) are shown in Table 2.

At this stage, energy distribution of light incident to the resist film in the X-axis direction is analyzed using a simulation software PROLITH ver. 11.0 (manufactured by KLA-Tencor Corporation). The results are plotted on a graph shown in FIG. 2. In this graph, the horizontal axis indicates distance from the centre (zero position) of the exposed portion (line portion) in the X-axis direction (X-Position; unit: nm), whereas the vertical axis indicates incident light intensity (Relative Intensity).

TABLE 2

|  | Illumination conditions | Photomask | NILS |
|---|---|---|---|
| Condition 1 | Dipole-X (0.76/0.95) | 6% Att-PSM | 3.113 |
| Condition 2 | Dipole-X (0.76/0.95) | BIM | 2.621 |
| Condition 3 | Crosspole (0.76/0.95) | 6% Att-PSM | 1.998 |
| Condition 4 | Crosspole (0.76/0.95) | BIM | 1.447 |
| Condition 5 | Annular (0.76/0.95) | 6% Att-PSM | 2.091 |

In Table 2, "Dipole-X" indicates a dipole illumination system in the X-axis direction, "Crosspole" indicates a crosspole (quadrupole) illumination system, and "Annular" indicates an annular illumination system. The expression (0.76/0.95) indicates Inner σ of 0.76 and Outer σ of 0.95.

Further, the expression "6% Att-PSM" indicates a 6% halftone type phase shift mask, and "BIM" indicates a binary mask. In the present Test Example, as these photomasks, those having a target size of [1 line/1 space] pattern of 75 nm (that is, a pattern composed of 1 line having a width of 75 nm and 1 space adjacent thereto having a width of 75 nm) were used.

Figure 2:
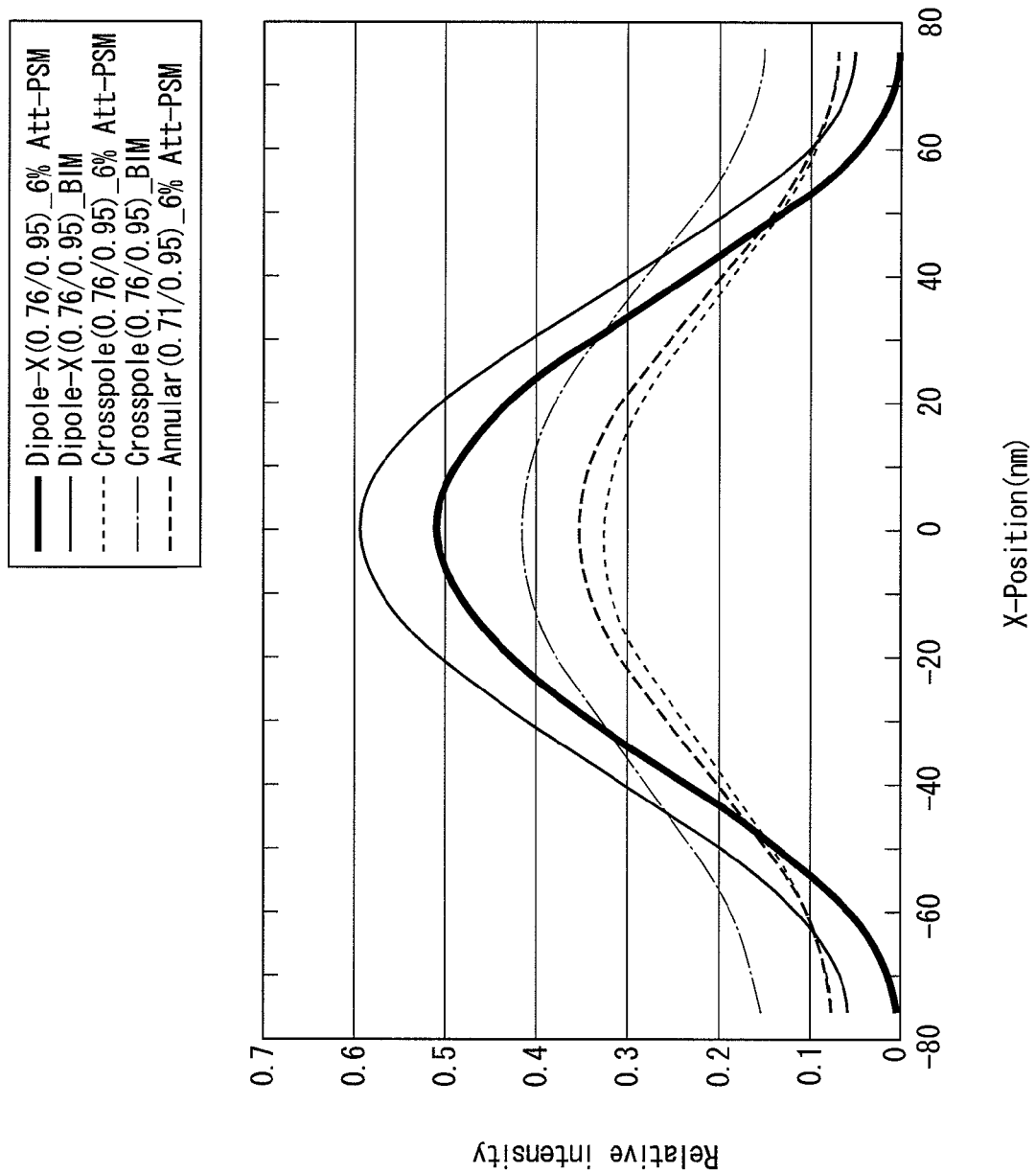
FIG. 2 is a graph showing the results of Test Example 1.

Further, NILS indicates, with respect to the light intensity distribution curve shown in FIG. 2, a slope of the curve at a position that corresponds to the end of the resist pattern (namely, positions at ±37.5 nm). The larger the NILS value is, the better.

As shown in FIG. 2, incident light intensity at positions where X-Positions were ±75 nm (namely, positions that correspond to the centre of a space portion (unexposed portion) in the case of a 1:1 line and space pattern) was lowest in Condition 1, where the Dipole-X system (illumination conditions) and 6% Att-PSM (photomask) were combined, which was almost zero. From this result, among the tested Conditions 1 to 5, it was confirmed that in terms of combinations of illumination conditions and photomasks during formation of the above-mentioned pattern, the combination adopted in Condition 1 was most suited.

Further, in Condition 2 where the Dipole-X system (illumination conditions) and BIM (photomask) were combined, incident light intensity at positions where X-Positions were ±75 nm was relatively low and incident light intensity at positions where X-Positions were 0 nm (namely, the centre of the line) was high, and thus the difference between the two values was great. Accordingly, it was confirmed that the combination adopted in Condition 2 was also suitable as a combination of illumination conditions and photomasks during formation of the above-mentioned pattern.

Example 1

Resist patterns were formed in the following manner by the same steps as shown in FIG. 1.

An organic antireflection film composition (product name: ARC29A, manufactured by Brewer Science Ltd.) was applied onto a 12-inch silicon wafer using a spinner, and the composition was then baked and dried on a hotplate at 205° C. for 60 seconds, thereby forming an organic antireflection film having a film thickness of 85 nm. Then, the negative resist composition 1 obtained above was applied onto the organic antireflection film using a spinner, and was then prebaked (PAB) on a hotplate at 90° C. for 60 seconds and dried, thereby forming a resist film having a film thickness of 100 nm.

Subsequently, the resist film was selectively irradiated (exposure dose: 27 mJ/cm$^2$) with an ArF excimer laser (193 nm) through a 6% half-tone type phase shift mask (6% Att-PSM; transmittance: 6%) as a photomask, in which a line pattern was formed in the Y-axis direction, using an ArF exposure apparatus Nikon NSR-S308F (manufactured by Nikon Corporation, NA (numerical aperture)=0.92, illumination conditions: dipole illumination system (Dipole-X)). The target sizes were set to "line width of 80 nm, pitch of 160 nm", "line width of 70 nm, pitch of 140 nm", and "line width of 65 nm, pitch of 130 nm".

Subsequently, the resist film was selectively irradiated through a 6% half-tone type phase shift mask (6% Att-PSM; transmittance: 6%) as a photomask, in which a line pattern was formed in the X-axis direction. At this time, a dipole illumination system (Dipole-Y) was adopted as illumination conditions and the exposure dose was changed to 24 mJ/cm$^2$. Under the above-mentioned conditions, the resist film was selectively irradiated with an ArF excimer laser. The target sizes were set to the same as those set in the first exposure step.

Thereafter, a post exposure bake (PEB) treatment was conducted at 110° C. for 60 seconds, followed by development for 10 seconds at 23° C. in a 2.38% by weight aqueous tetramethylammonium hydroxide (TMAH) solution. Then, the resist film was rinsed for 20 seconds with pure water. Then the resist film was further subjected to a heat treatment (postbake) at 100° C. for 60 seconds.

As a result, in the resist film, a hole pattern in which the hole diameter was 80 nm and the pitch was 160 nm, a hole pattern in which the hole diameter was 70 nm and the pitch was 140 nm, and a hole pattern in which the hole diameter was 65 nm and the pitch was 130 nm, were formed.

Comparative Example 1

An organic antireflection film composition (product name: ARC29A, manufactured by Brewer Science Ltd.) was applied onto an 12-inch silicon wafer using a spinner, and the composition was then baked and dried on a hotplate at 205° C. for 60 seconds, thereby forming an organic antireflection film having a film thickness of 85 nm. Then, the positive resist composition 1 obtained above was applied onto the organic antireflection film using a spinner, and was then prebaked (PAB) on a hotplate at 135° C. for 60 seconds and dried, thereby forming a resist film having a film thickness of 100 nm.

Subsequently, the resist film was selectively irradiated (exposure dose: 30 mJ/cm$^2$) with an ArF excimer laser (193 nm) through a 6% half-tone type phase shift mask (6% Att-PSM; transmittance: 6%) as a photomask having a target size of "hole diameter of 85 nm, pitch of 170 nm" or "hole diameter of 80 nm, pitch of 160 nm", using an ArF exposure apparatus Nikon NSR-S308F (manufactured by Nikon Corporation, NA (numerical aperture)=0.92, illumination conditions: crosspole illumination system (Inner σ: 0.76/Outer σ: 0.95)).

Note that conventionally, a crosspole illumination system, in which light enters equally from 4 directions, has been thought to be advantageous in obtaining hole patterns having better shapes than those of the hole patterns obtained by a dipole illumination system, in which light enters from 2 directions.

Thereafter, a PEB treatment was conducted at 110° C. for 60 seconds, followed by development for 10 seconds at 23° C. in a 2.38% by weight aqueous tetramethylammonium hydroxide (TMAH) solution. Then, the resist film was rinsed for 20 seconds with pure water. Then the resist film was further subjected to a heat treatment (postbake) at 100° C. for 60 seconds.

As a result, in the resist film, a hole pattern in which the hole diameter was 85 nm and the pitch was 170 nm was formed. However, a hole pattern in which the hole diameter was 80 nm and the pitch was 160 nm could not be formed.

[Evaluation of Resist Pattern Shape]

With respect to the hole patterns formed in Example 1 and Comparative Example 1, upper surface profiles were observed using a scanning electron microscope (SEM). The obtained SEM images of each hole pattern were shown in FIG. 3A and FIG. 3B, respectively. FIG. 3A shows the results of Example 1, whereas FIG. 3B shows the results of Comparative Example 1. As shown in FIGS. 3A and 3B, the hole patterns formed in Example 1 exhibited excellent circularity and a minimal level of roughness. On the other hand, the hole patterns formed in Comparative Example 1 exhibited lower resolution, lower level of circularity in terms of hole shape, and also a marked level of roughness.

From these results, it was confirmed that a hole pattern with a high level of resolution and an excellent shape can be formed by using the method of forming a resist pattern according to the present invention.

Example 2

Resist patterns were formed in the following manner by the same steps as shown in FIG. 1.

An organic antireflection film composition (product name: ARC29A, manufactured by Brewer Science Ltd.) was applied onto an 12-inch silicon wafer using a spinner, and the composition was then baked and dried on a hotplate at 205° C. for 60 seconds, thereby forming an organic antireflection film having a film thickness of 85 nm. Then, the negative resist composition 1 obtained above was applied onto the organic antireflection film using a spinner, and was then prebaked (PAB) on a hotplate at 90° C. for 60 seconds and dried, thereby forming a resist film having a film thickness of 100 nm.

Subsequently, the resist film was selectively irradiated (exposure dose: 27 mJ/cm$^2$) with an ArF excimer laser (193 nm) through a 6% half-tone type phase shift mask (6% Att-PSM; transmittance: 6%) as a photomask, in which a line pattern was formed in the Y-axis direction, using an ArF exposure apparatus Nikon NSR-S308F (manufactured by Nikon Corporation, NA (numerical aperture)=0.92, illumination conditions: dipole illumination system (Dipole-X)). The target size was set to "line width of 60 nm, pitch of 140 nm".

Subsequently, the resist film was selectively irradiated through a 6% half-tone type phase shift mask (6% Att-PSM; transmittance: 6%) as a photomask, in which a line pattern was formed in the X-axis direction. At this time, a dipole illumination system (Dipole-Y) was adopted as illumination conditions and the exposure dose was changed to 35 mJ/cm². Under the above-mentioned conditions, the resist film was selectively irradiated with an ArF excimer laser. The target size was set to "line width of 60 nm, pitch of 300 nm".

Thereafter, a PEB treatment was conducted at 110° C. for 60 seconds, followed by development for 10 seconds at 23° C. in a 2.38% by weight aqueous tetramethylammonium hydroxide (TMAH) solution. Then, the resist film was rinsed for 20 seconds with pure water. Then the resist film was further subjected to a heat treatment (post-bake) at 100° C. for 60 seconds.

Figure 4:
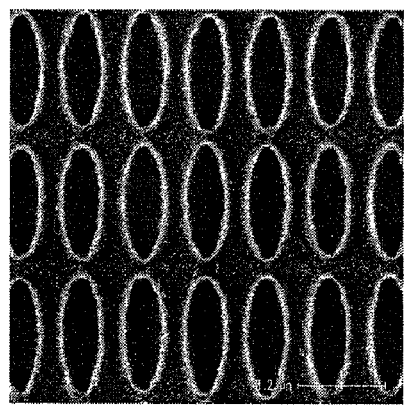
FIG. 4 is an SEM image of elliptical shaped hole patterns formed in Example 2, and a schematic diagram showing the size of hole diameter and pitch.
Figure 4:
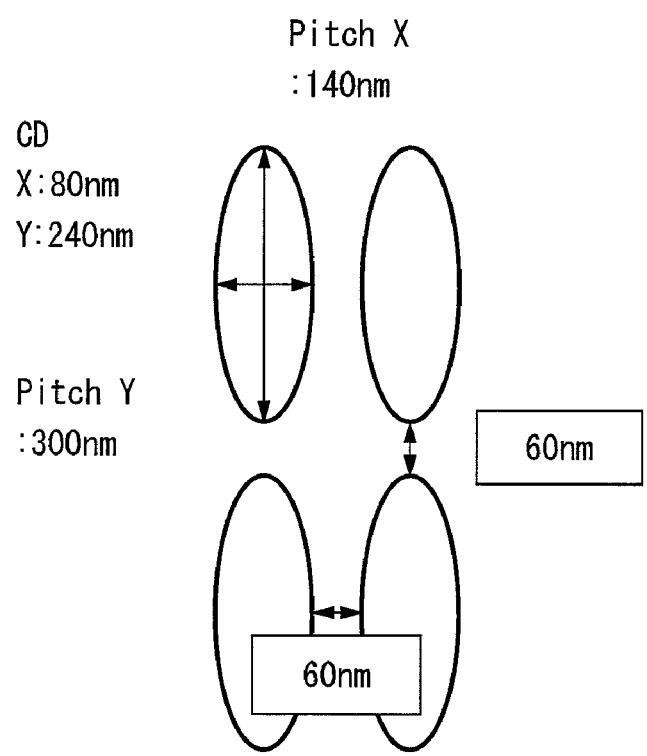
Figure 5A:
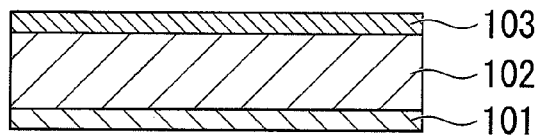
FIGS. 5A to 5F show a flow chart describing one example of a conventional double patterning process.
Figure 5B:
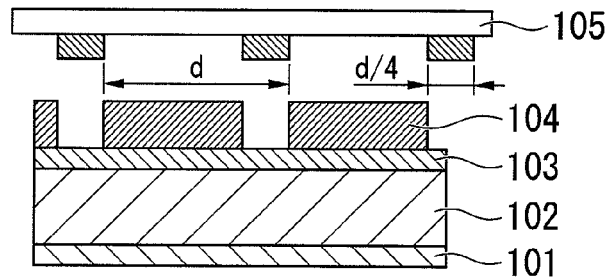
Figure 5C:
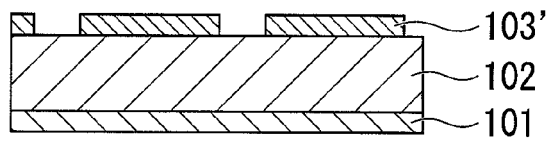
Figure 5D:
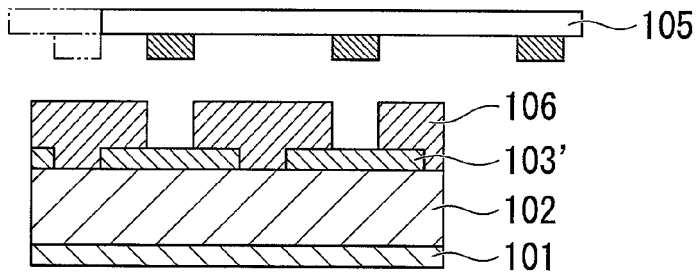
Figure 5E:
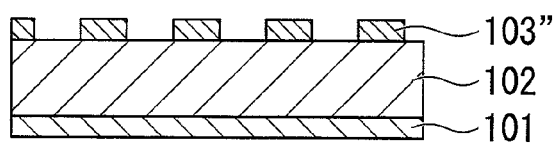
Figure 5F:
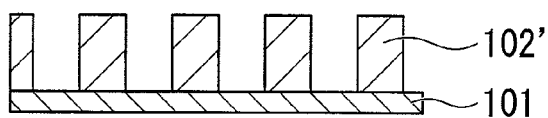

As a result, in the resist film, elliptical shaped holes shown in FIG. 4 were formed.

From these results, it was confirmed that an elliptical shaped hole pattern with a high level of resolution can also be formed with an excellent shape, by using the method of forming a resist pattern according to the present invention.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a resist pattern comprising:
    forming a resist film on a substrate using a chemically amplified negative resist composition;
    forming a latent image of a first line and space pattern by subjecting the resist film to first exposure through a first photomask;
    forming a latent image of a second line and space pattern so as to intersect with the latent image of the first line and space pattern by subjecting the resist film to second exposure through a second photomask; and
    developing the resist film having the latent image of the first line and space pattern and the latent image of the second line and space pattern formed thereon to form a hole pattern in the resist film, wherein
    the first mask is designed to form line and space patterns which have different line directions from the line direction of line and space patterns formed by the second mask, and
    the chemically amplified negative resist composition comprises a base material component (A) that is soluble in an alkali developing solution and an acid-generator component (B) that generates acid upon exposure, wherein
    the component (B) comprises a compound represented by general formula (b-1) or (b-2) shown below:

$$\begin{array}{c} R^{1'''} \\ | \\ R^{2'''} - S^+ \quad R^{4'''}SO_3^- \\ | \\ R^{3'''} \end{array} \quad \text{(b-1)}$$

$$\begin{array}{c} R^{5''} \\ \diagdown \\ R^{6''} \end{array} I^+ \quad R^{4'''}SO_3^- \quad \text{(b-2)}$$

wherein $R^{1'''}$ to $R^{3'''}$, $R^{5''}$ and $R^{6''}$ each independently represents an aryl group or alkyl group, wherein two of $R^{1'''}$ to $R^{3'''}$ in formula (b-1) may be bonded to each other to form a ring with the sulfur atom in the formula; and $R^{4'''}$ represents an alkyl group, a halogenated alkyl group, an aryl group or an alkenyl group which may have a substituent, with the proviso that at least one of $R^{1'''}$ to $R^{3'''}$ represents an aryl group, and at least one of $R^{5''}$ and $R^{6''}$ represents an aryl group.

2. The method of forming a resist pattern according to claim 1, wherein the exposure is conducted by a dipole illumination system.

3. The method of forming a resist pattern according to claim 1, wherein a phase shift mask is used as the photomask.

4. The method of forming a resist pattern according to claim 1, wherein the second photomask has a different line width or pitch from that of the first photomask.

5. The method of forming a resist pattern according to claim 1, wherein the resist pattern is randomly arranged hole patterns formed by making isolated slit patterns to intersect.

6. The method of forming a resist pattern according to claim 1, wherein $R^{4'''}$ in the general formula (b-1) or (b-2) is a group represented by formula $X-Q^1-Y^1-$, wherein $Q^1$ represents a divalent linking group containing an oxygen atom; X represents a hydrocarbon group of 3 to 30 carbon atoms which may have a substituent; and $Y^1$ represents an alkylene group of 1 to 4 carbon atoms which may have a substituent, or a fluorinated alkylene group of 1 to 4 carbon atoms which may have a substituent.

7. The method of forming a resist pattern according to claim 6, wherein the group represented by formula $X-Q^1-Y^1-SO_3-$ in the general formula (b-1) or (b-2) is a group selected from the group consisting of formulas (b1) to (b7) shown below:

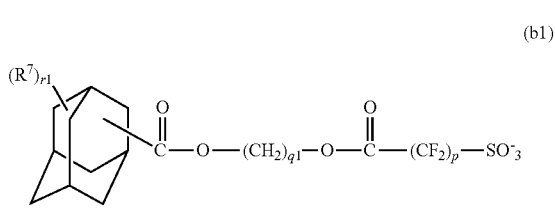

(b1)

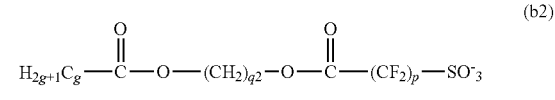

(b2)

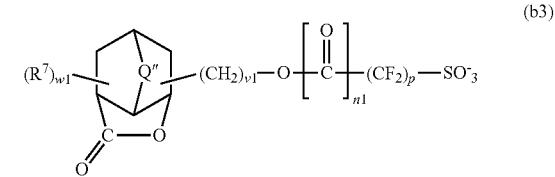

(b3)

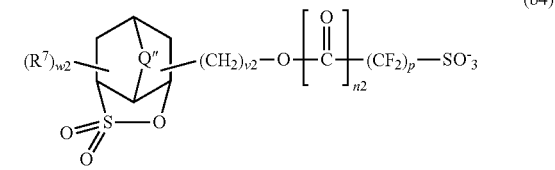

(b4)

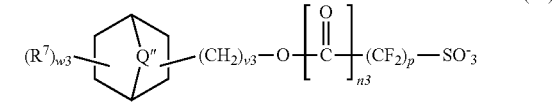

(b5)

-continued

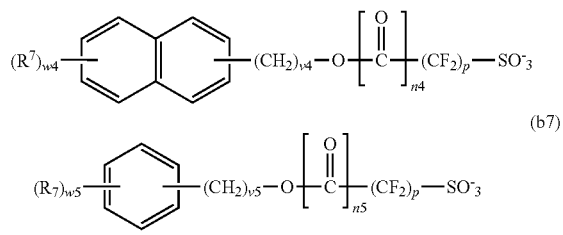

wherein p represents an integer of 1 to 3; each of q1 and q2 independently represents an integer of 1 to 5; r1 represents an integer of 0 to 3; g represents an integer of 1 to 20; $R^7$ represents a substituent; each of n1 to n5 independently represents 0 or 1; each of v1 to v5 independently represents an integer of 0 to 3; each of w1 to w5 independently represents an integer of 0 to 3;

and Q" represents an alkylene group of 1 to 5 carbon atoms, —O—, —S—, —O—$R^{94}$— or —S—$R^{95}$—, provided that each of $R^{94}$ and $R^{95}$ independently represents an alkylene group of 1 to 5 carbon atoms.

8. The method of forming a resist pattern according to claim 1, wherein the wavelength to be used for the first and second exposure processes is ArF excimer laser.

* * * * *